United States Patent
Sugiyama et al.

(10) Patent No.: US 11,257,655 B2
(45) Date of Patent: Feb. 22, 2022

(54) FOCUSED ION BEAM APPARATUS, AND CONTROL METHOD FOR FOCUSED ION BEAM APPARATUS

(71) Applicant: HITACHI HIGH-TECH SCIENCE CORPORATION, Tokyo (JP)

(72) Inventors: Yasuhiko Sugiyama, Tokyo (JP); Naoko Hirose, Tokyo (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 0 days.

(21) Appl. No.: 17/072,691

(22) Filed: Oct. 16, 2020

(65) Prior Publication Data

US 2021/0118642 A1 Apr. 22, 2021

(30) Foreign Application Priority Data

Oct. 18, 2019 (JP) .............................. JP2019-191371

(51) Int. Cl.
| | |
|---|---|
| *H01J 37/12* | (2006.01) |
| *H01J 37/147* | (2006.01) |
| *H01J 37/08* | (2006.01) |
| *H01J 37/28* | (2006.01) |
| *H01J 37/153* | (2006.01) |

(52) U.S. Cl.
CPC .............. *H01J 37/12* (2013.01); *H01J 37/08* (2013.01); *H01J 37/1477* (2013.01); *H01J 37/153* (2013.01); *H01J 37/28* (2013.01); *H01J 2237/24564* (2013.01); *H01J 2237/31749* (2013.01)

(58) Field of Classification Search
CPC ........ H01J 37/12; H01J 37/08; H01J 37/1477; H01J 37/153; H01J 37/28; H01J 2237/24564; H01J 2237/31749
See application file for complete search history.

(56) References Cited

FOREIGN PATENT DOCUMENTS

| JP | 1984-066043 A | 4/1984 |
|---|---|---|
| JP | 1988-231852 A | 9/1988 |
| JP | 1993-035540 A | 2/1993 |
| JP | H10106474 A | 4/1998 |
| JP | H11223588 A | 8/1999 |
| JP | 2007103108 A | 4/2007 |
| JP | 2007193977 A | 8/2007 |
| JP | 2009272293 A | 11/2009 |
| JP | 2013196862 | 9/2013 |

*Primary Examiner* — Nicole M Ippolito
*Assistant Examiner* — Hanway Chang
(74) *Attorney, Agent, or Firm* — Holland & Hart LLP

(57) ABSTRACT

The focused ion beam apparatus includes: an ion source configured to generate ions; a first electrostatic lens configured to accelerate and focus the ions to form an ion beam; a beam booster electrode configured to accelerate the ion beam to a higher level; one or a plurality of electrodes, which are placed in the beam booster electrode, and are configured to electrostatically deflect the ion beam; a second electrostatic lens, which is provided between the one or plurality of electrodes and a sample table, and is configured to focus the ion beam applied with a voltage; and a processing unit configured to obtain a measurement condition, and set at least one of voltages to be applied to the one or plurality of electrodes or a voltage to be applied to each of the first electrostatic lens and the second electrostatic lens, based on the obtained measurement condition.

17 Claims, 34 Drawing Sheets

SCANNING VOLTAGE INFORMATION

| ACCELERATION VOLTAGE VALUE (kV) | 10 | |
|---|---|---|
| ACCELERATION VOLTAGE VALUE (kV) | 5 | |
| ACCELERATION VOLTAGE VALUE (kV) | 30 | |
| OPERATION MODE | ACCELERATION MODE | DECELERATION MODE |
| RATIO BETWEEN FIRST VOLTAGE VALUE AND SECOND VOLTAGE VALUE | 1 : 0.953 | 1 : 0.942 |
| FIRST VOLTAGE VALUE (V) | 210 | 228 |

92

SCANNING VOLTAGE INFORMATION 92a

| ACCELERATION VOLTAGE VALUE (kV) | 30 | 1 | 5 |
|---|---|---|---|
| OPERATION MODE | DECELERATION MODE | ACCELERATION MODE | ACCELERATION MODE |
| BEAM BOOSTER VOLTAGE VALUE (kV) | 0 | −5 | −5 |
| PRINCIPAL SURFACE POSITION (mm) | −24.6 | −29.0 | −23.7 |
| RATIO BETWEEN FIRST VOLTAGE VALUE AND SECOND VOLTAGE VALUE | 1:0.942 | 1:0.986 | 1:0.937 |
| FIRST VOLTAGE VALUE (V) | 228 | 35.5 | 80 |

CONDENSER LENS VOLTAGE INFORMATION

| Vb (kV) | Vacc=5kV | Vacc=3kV | Vacc=2kV | Vacc=1kV |
|---|---|---|---|---|
| -2 | 3.05 | 1.40 | 0.58 | -0.25 |
| -3 | 2.85 | 1.22 | 0.40 | -0.42 |
| -4 | 2.67 | 1.04 | 0.23 | -0.60 |
| -5 | 2.48 | 0.85 | 0.04 | -0.79 |

FIG. 32

OBJECTIVE LENS VOLTAGE INFORMATION

| Vb | Vacc=5kV | Vacc=3kV | Vacc=2kV | Vacc=1kV |
|---|---|---|---|---|
| -2 | -10.55 | -7.08 | -5.13 | -2.88 |
| -3 | -11.55 | -7.72 | -5.55 | -2.94 |
| -4 | -12.25 | -8.15 | -5.75 | -2.89 |
| -5 | -12.85 | -8.46 | -5.86 | -2.74 |

FIG. 35

FOCUSED ION BEAM APPARATUS, AND CONTROL METHOD FOR FOCUSED ION BEAM APPARATUS

The present application claims priorities to Japanese Patent Application No. 2019-191371, filed Oct. 18, 2019, the entire content of which is incorporated herein for all purposes by this reference.

BACKGROUND OF THE INVENTION

1. Field of the Invention

The present invention relates to a focused ion beam apparatus, and a control method for a focused ion beam apparatus.

2. Description of the Related Art

In processing a sample shape typically for producing a sample for a transmission electron microscope (TEM) with the use of a focused ion beam (FIB) apparatus, there is a demand to minimize damage that may be applied to a sample by irradiation with an ion beam. To meet the demand, an acceleration energy of the ion beam is reduced to several kV or lower to process the sample.

Specifically, there has been known a technology of processing a sample shape, in which rough processing is performed at 30 kV and finishing processing is performed at 10 kV (see, for example, Japanese Patent No. 3333731). There has been also known a technology of effectively removing a damaged layer by reducing energy of an ion beam used for finishing processing and also by optimizing an incident angle of the ion beam to a sample in accordance with a sample shape (see, for example, Japanese Patent No. 5142240). There has been also known a technology of reducing an acceleration voltage so as to reduce a damaged layer (see, for example, Japanese Patent No. 5537050).

However, when the acceleration voltage of the focused ion beam is reduced, there are prominently seen an increase in amount of beam blur caused by chromatic aberration and expansion of a beam profile caused by the Coulomb interaction. That is, when the reduced acceleration voltage is used, chromatic aberration is increased and an ion beam cannot be sufficiently concentrated. Thus, a fine ion probe cannot be achieved. As a solution to the above-mentioned problem, there has been known a technology of selectively causing an acceleration lens operation and a deceleration lens operation in accordance with an acceleration voltage to act so that chromatic aberration hardly changes (see, for example, Japanese Patent Application Laid-open No. Hei 5-35540).

There has been also known a beam booster technology of increasing potential energy in an intermediate portion of an optical system and decreasing the potential energy with the use of an objective lens (see, for example, Japanese Patent Application Laid-open No. 2007-103108, and Michael Rauscher and Erich Plies, "Low Energy focused ion beam system design," Journal of Vacuum Science & Technology A, American Vacuum Society, 2006, 24(4), pp. 1055-1066).

The focused ion beam may be used at a higher acceleration voltage (for example, 30 kV) at the time of processing and etching, and at a reduced acceleration voltage (for example, from 1 kV to 5 kV) at the time of finishing processing so as to remove a damage layer resulting from the processing.

There has been known a technology of controlling, when an acceleration voltage is changed, a voltage of an optical system in conjunction with the changed acceleration voltage (see, for example, Japanese Patent Application Laid-open No. Sho 59-66043, and Japanese Patent Application Laid-open No. Sho 63-231852).

When a beam booster potential is applied concurrently with reduction of an acceleration voltage, an ion beam travels in abeam booster tube at an energy equal to or higher than the acceleration voltage.

In the beam booster tube, the following electrodes are placed. The electrodes are basically electrostatic deflectors and called in different ways in accordance with their functions. For example, an electrode called a "blanking electrode" is configured to electrostatically deflect a beam to deviate the beam from an optical axis so that the beam is not applied onto a sample. An electrode called an "alignment electrode" is configured to electrostatically deflect and adjust the beam so that the beam is aligned with an optical axis of a lens. An electrode called an "astigmatism correction electrode" is configured to electrostatically deflect the beam and adjust circularity of a sectional shape of the ion beam so that the beam has a circular sectional shape. An electrode called a "scanning electrode" is configured to electrostatically deflect the beam to be scanned on a sample surface.

In the configuration in which those electrodes are placed in the beam booster tube, when an acceleration voltage or a beam booster voltage is changed, the following problem arises. With the beam booster tube not having a cylindrical shape, a similar problem arises as well when power supplies of the blanking electrode, the astigmatism correction electrode, and the alignment electrode are floating at a beam booster potential.

FIG. 1A to FIG. 1C are views for illustrating how to control a blanking voltage when an acceleration voltage is changed.

FIG. 1A is an illustration of a case in which a blanking voltage Vblk1 is applied to a blanking electrode BE. In this case, a beam at an acceleration voltage Vacc1 is electrostatically deflected and applied to a desired place on a blanking aperture BA.

FIG. 1B is an illustration of a case in which the acceleration voltage is changed from Vacc1 to Vacc2 (provided that Vacc2<Vacc1). The blanking voltage remains unchanged, that is, at Vblk1. In this case, a deflection amount is too large to cause the beam at the acceleration voltage Vacc2 to be applied to a desired portion of the blanking aperture BA. When the beam is not applied to the desired portion or place of the blanking aperture BA, a portion irradiated with the beam is etched by the ion beam. This may result in malfunction of the apparatus.

FIG. 1C is an illustration of a case in which the acceleration voltage is changed from Vacc1 to Vacc3 (provided that Vacc3=k×Vacc1, where k represents a proportionality constant). When the blanking voltage is changed to k×Vblk1, as in the case of FIG. 1A, the beam is applied to a desired position of the blanking aperture BA. A similar description is seen in Japanese Patent Application Laid-open No. Sho 59-66043.

FIG. 2A and FIG. 2B are views for illustrating a case of applying a beam booster voltage.

FIG. 2A is an illustration of a case of applying the blanking voltage Vblk1 to the blanking electrode BE. Here, an application voltage Vb1 for a beam booster tube BT is zero. Through the application of the blanking voltage Vblk1 to the blanking electrode BE, the beam at the acceleration voltage Vacc1 is electrostatically deflected and applied to the desired place of the blanking aperture BA.

FIG. 2B is an illustration of a case in which a voltage of a beam booster power supply is set to Vb2 (provided that Vb2 is a negative voltage for accelerating the ion beam). The acceleration voltage remains unchanged, that is, at Vacc1. The blanking voltage also remains unchanged, and Vblk1 is applied. In this case, the ion beam in the beam booster tube is at an energy of (Vacc1+Vb2) eV, and the blanking voltage is therefore insufficient to apply the beam to the desired portion of the blanking aperture. Thus, the deflection amount is too small to cause the beam to be applied to the desired portion of the blanking aperture BA. That is, there is a fear that places other than the desired one are etched by the ion beam, and the apparatus malfunctions. Further, in such a state that the beam booster voltage is applied, when the acceleration voltage is set to Vacc3 (provided that Vacc3=k× Vacc1, where k represents a proportionality constant) and the blanking voltage is changed to k×Vblk1 as in FIG. 1C, the beam is similarly not applied to the desired portion of the blanking aperture. The ion beam in the beam booster tube is at an energy of (Vacc3+Vb2) eV, and the blanking voltage is therefore insufficient to apply the beam to the desired portion of the blanking aperture. Thus, even when the method described in Japanese Patent Application Laid-open No. Sho 59-66043 is applied, this method gives no solution to the above-mentioned problem.

The degree of astigmatism varies depending on processing circularity or machine assembly precision of an optical component. With regard to a range of a voltage to be applied to the astigmatism correction electrode in order to correct the astigmatism, a similar problem to that in the blanking voltage occurs. For example, in a case of the beam booster voltage being zero, when a range of the voltage to be applied to the astigmatism correction electrode is ±10 V at the acceleration voltage of 30 kV, the range of the voltage to be applied to the astigmatism correction electrode may be set to ±3.3 V at the acceleration voltage of 10 kV. However, in such a state that the beam booster voltage is applied, even when the range of the voltage to be applied to the astigmatism correction electrode is set to ±3.3 V at the acceleration voltage of 10 kV, there is a fear that the voltage is insufficient to correct the astigmatism.

The deviation between optical axes of a condenser lens and an objective lens occurs depending on the machine assembly precision of lens electrodes and an optical component provided between the lens electrodes. With regard to a range of a voltage to be applied to the alignment electrode in order to correct the deviation of the optical axes, a similar problem to that in the blanking voltage occurs. For example, in a case of the beam booster voltage being zero, when a range of the voltage to be applied to the alignment electrode is ±10 V at the acceleration voltage of 30 kV, the range of the voltage to be applied to the alignment electrode may be set to ±3.3 V at the acceleration voltage of 10 kV. However, in such a state that the beam booster voltage is applied, even when the range of the voltage to be applied to the alignment electrode is set to ±3.3 V at the acceleration voltage of 10 kV, there is a fear that the voltage is insufficient to correct the optical axes.

Although it is one fact that the condenser lens and the objective lens depend on a lens system, in a case of an electrostatic lens system, when only the acceleration voltage is used for determination, there is a fear that a desired lens power cannot be obtained as with the blanking electrode.

Even when the method described in Japanese Patent No. 3544438 is applied to the above-mentioned problem, this method gives no solution. In Japanese Patent No. 3544438, there is description about storing, in a computer, values of voltages impressed on the objective lens so as to carry out a plurality of workings. However, there is no description about a beam booster. It is therefore impossible to guess what problem occurs in what way, and how to set a plurality of scanning voltages. Even when voltages of the blanking electrode, the alignment electrode, the astigmatism correction electrode, the condenser lens, and the objective lens are controlled not in association with the application voltage for the beam booster electrode, this gives no solution.

Even when the method described in Japanese Patent No. 5969229 is applied to the above-mentioned problem, this method gives no solution. The method of Japanese Patent No. 5969229 is directed to controlling a condenser voltage of a condenser lens, and is intended to set the condenser voltage so as to adjust a beam current. In Japanese Patent No. 5969229, there is no description about a beam booster and about a plurality of scanning electrodes. It is therefore impossible to guess what problem occurs in what way and how to set a plurality of scanning voltages.

SUMMARY OF THE INVENTION

The present invention has been made in view of the foregoing, and has an object to provide a focused ion beam apparatus, and a control method for a focused ion beam apparatus, with which in the focused ion beam apparatus in which one or a plurality of electrodes are placed in a beam booster tube, or are floating at a beam booster potential, it is possible to control a beam to have a desired trajectory when an acceleration voltage and a beam booster voltage are changed.

In order to solve the above-mentioned problem to achieve the above-mentioned object, the present invention adopts the following aspects.

(1) According to at least one aspect of the present invention, there is provided a focused ion beam apparatus including: an ion source configured to generate ions; a first electrostatic lens configured to accelerate and focus the ions to form an ion beam; a beam booster electrode configured to accelerate the ion beam to a higher level; one or a plurality of electrodes, which are placed in the beam booster electrode, and are configured to electrostatically deflect the ion beam; a second electrostatic lens, which is provided between the one or plurality of electrodes and a sample table, and is configured to focus the ion beam applied with a voltage; and a processing unit configured to obtain a measurement condition, and set at least one of voltages to be applied to the one or plurality of electrodes or a voltage to be applied to each of the first electrostatic lens and the second electrostatic lens, based on the obtained measurement condition.

(2) In the focused ion beam apparatus according to the above-mentioned aspect (1), the processing unit is configured to: obtain, from application voltage information in which measurement conditions are associated with information that specifies at least one voltage out of pieces of information that specify voltages to be applied to the one or plurality of electrodes and information that specifies a voltage to be applied to each of the first electrostatic lens and the second electrostatic lens, information that specifies at least one voltage, which corresponds to the obtained measurement condition, out of pieces of information that specify voltages to be applied to the one or plurality of electrodes and information that specifies a voltage to be applied to each of the first electrostatic lens and the second electrostatic lens; and set at least one voltage out of the voltages to be applied to the one or plurality of electrodes and the voltage to be applied to each of the first electrostatic lens and the second electrostatic lens, based on the obtained information that specifies at least one voltage.

(3) In the focused ion beam apparatus according to the above-mentioned aspect (1) or (2), the one or plurality of electrodes include: an alignment electrode, which is placed in the beam booster electrode, and is configured to correct a deviation of an optical axis of the ion beam; an astigmatism correction electrode, which is placed in the beam booster electrode, and is configured to correct circularity of a sectional shape of the ion beam; a blanking electrode, which is placed in the beam booster electrode, and is configured to deflect the ion beam; and a first scanning electrode and a second scanning electrode, which are placed in the beam booster electrode, and are configured to scan the ion beam on a sample.

(4) In the focused ion beam apparatus according to any one of the above-mentioned aspects (1) to (3), the measurement condition includes information that specifies an acceleration voltage and information that specifies a beam booster voltage.

(5) In the focused ion beam apparatus according to any one of the above-mentioned aspects (1) to (4), the processing unit is configured to obtain, from information that specifies an acceleration voltage and information that specifies a beam booster voltage, a sum of the acceleration voltage and the beam booster voltage, and set at least one voltage out of voltages to be applied to the one or plurality of electrodes based on the obtained sum.

(6) According to at least one aspect of the present invention, there is provided a control method for a focused ion beam apparatus, the focused ion beam apparatus including: an ion source configured to generate ions; a first electrostatic lens configured to accelerate and focus the ions to form an ion beam; a beam booster electrode configured to accelerate the ion beam to a higher level; one or a plurality of electrodes, which are placed in the beam booster electrode, and are configured to electrostatically deflect the ion beam; and a second electrostatic lens, which is provided between the one or plurality of electrodes and a sample table, and is configured to focus the ion beam applied with a voltage, the control method including: obtaining a measurement condition; and setting at least one of voltages to be applied to the one or plurality of electrodes or a voltage to be applied to each of the first electrostatic lens and the second electrostatic lens, based on the obtained measurement condition.

According to at least one aspect of the present invention, it is possible to control the beam to have a desired trajectory.

BRIEF DESCRIPTION OF THE DRAWINGS

FIG. 32 is a diagram for illustrating an example of condenser lens voltage information.

FIG. 35 is a diagram for illustrating an example of objective lens voltage information.

DESCRIPTION OF THE EMBODIMENTS

Next, a charged particle beam apparatus and a control method for a charged particle beam apparatus according to embodiments of the present invention are described with reference to the drawings. The following embodiments are described merely as an example, and the present invention can be applied to any embodiment without limiting to the following embodiments. A focused ion beam apparatus is an example of the charged particle beam apparatus.

Throughout the drawings for illustrating the embodiments, components having the same function are denoted by identical reference symbols, and a duplicate description thereof is omitted.

The description "based on XX" as used herein means "based on at least XX," and encompasses "based on another element in addition to XX." Further, the description "based on XX" is not limited to a case of directly using "XX" but encompasses a case of being "based on a result of calculating or processing XX." The term "XX" refers to a freely selected element (for example, freely selected information).

First Embodiment

Figure 1A:
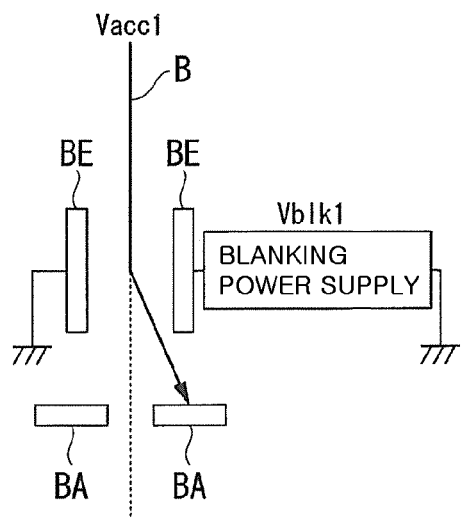
FIG. 1A, FIG. 1B, and FIG. 1C are views for illustrating how to control a blanking voltage when an acceleration voltage is changed.
Figure 1B:
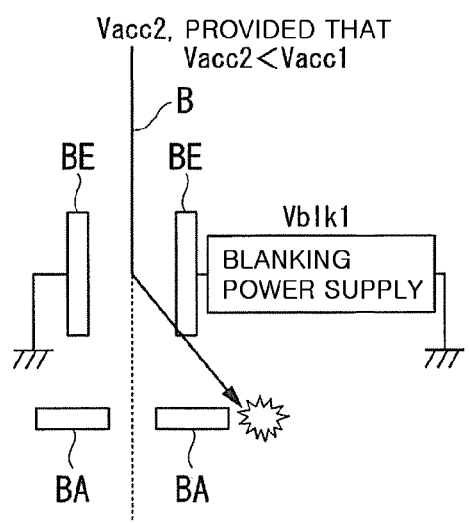
Figure 1C:
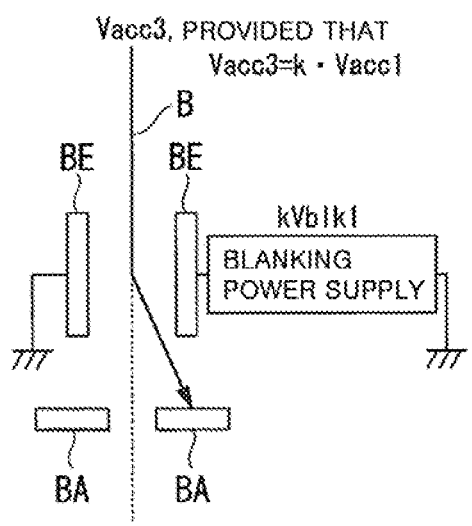
Figure 2A:
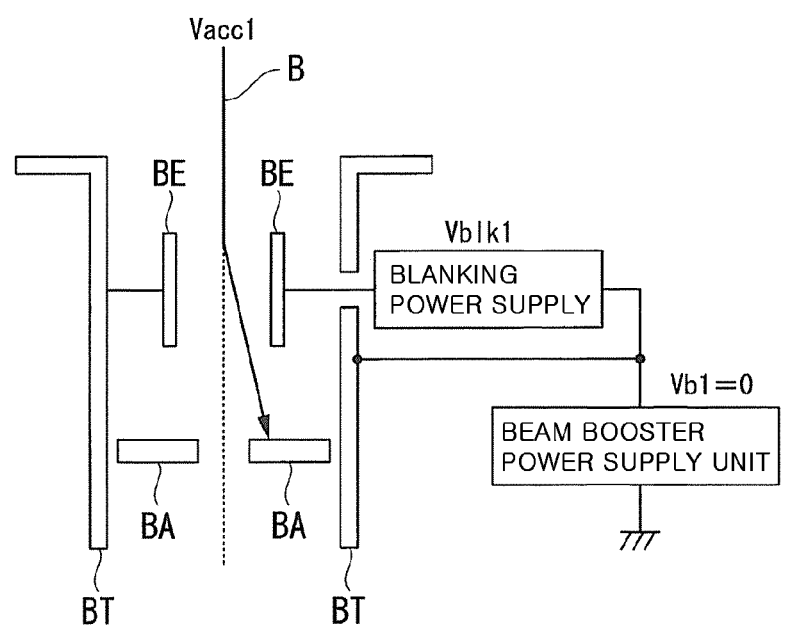
FIG. 2A and FIG. 2B are views for illustrating a case of applying a beam booster voltage.
Figure 2B:
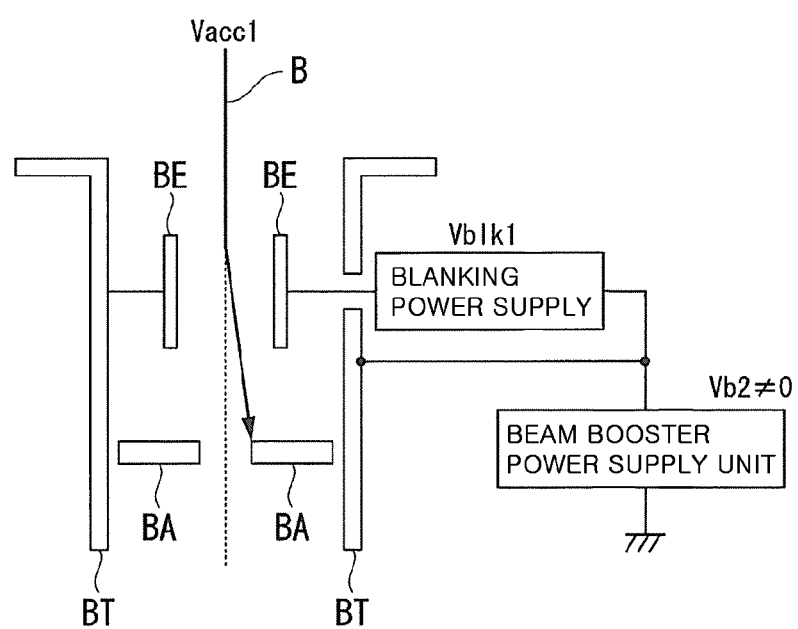
Figure 3:
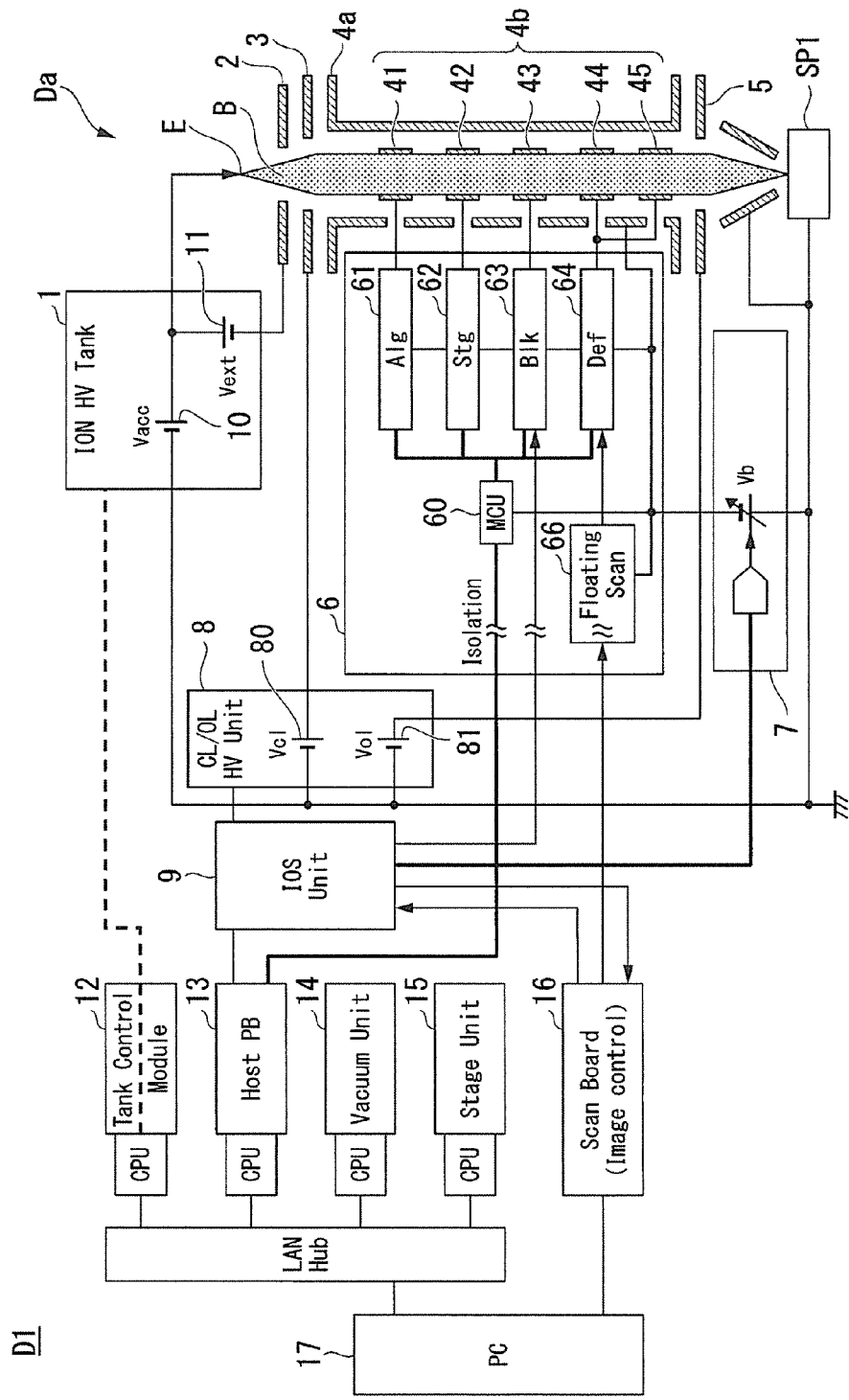
FIG. 3 is a diagram for illustrating a configuration example of a charged particle beam apparatus according to a first embodiment of the present invention.

FIG. 3 is a diagram for illustrating a configuration example of a charged particle beam apparatus according to a first embodiment of the present invention.

A charged particle beam apparatus D1 includes a charged particle beam apparatus main body (focused ion beam apparatus main body) Da, a beam booster control unit 6, a beam booster power supply unit 7, a lens power supply unit 8, a control unit 9, a tank control module 12, a host PB unit 13, a vacuum control unit 14, a stage control unit 15, a scan board 16, and a personal computer (PC) 17.

The focused ion beam apparatus main body Da includes an ion source control unit 1, an ion emitter E, an extraction electrode 2, a condenser lens center electrode 3, a beam booster tube 4a, and an objective lens center electrode 5. The focused ion beam apparatus main body Da is configured to accelerate an ion beam B to an acceleration voltage Vacc, and then focus the ion beam B through a condenser lens formed by an electric field generated among the condenser lens center electrode 3, the extraction electrode 2, and the beam booster tube 4a, and an objective lens formed by an electric field generated among the objective lens center electrode 5, the beam booster tube, and a ground electrode, so as to irradiate a sample SP1 on a sample table with the ion beam B. The sample SP1 is placed in a grounded state.

The ion source control unit 1 is configured to control emission of a charged particle beam. An example of the charged particle beam is the ion beam B. The following description is given of a case in which the ion beam B is adopted as the charged particle beam. The ion source control unit 1 includes an extraction power supply 11, and an acceleration power supply 10.

The ion emitter E is a charged particle source configured to generate charged particles. The ion emitter E is assumed to be a liquid metal ion source including metal with a sharp tip end that is wetted with liquid metal gallium, for example. As another example, the ion emitter E may be a gas field ion source that is supplied with helium, neon, oxygen, nitrogen, hydrogen, or other such gas in place of the liquid metal. As still another example, the ion emitter E may adopt an inductively coupled plasma ion source, an electron cyclotron resonance plasma ion source, or a Penning ion gauge (PIG) plasma ion source for its charged particle supply portion.

The extraction power supply 11 is configured to apply an extraction voltage Vext between the tip end of the ion emitter E and the extraction electrode 2, to thereby extract gallium ions as charged particles from the tip end of the ion emitter E.

The acceleration power supply 10 is configured to apply an acceleration voltage Vacc to the charged particles generated by the ion emitter E, to thereby produce the ion beam B and accelerate the produced ion beam B. The acceleration voltage Vacc is, by way of example, 30 kV at most. However, in order to minimize damage that may be applied to the sample by irradiation with the ion beam, the acceleration voltage may be set and used in each processing step with the focused ion beam. For example, the acceleration voltage may be set to 30 kV for rough processing, and for finishing processing, the acceleration voltage may be set to a lower value than in the rough processing, for example, 1 kV or 0.5 kV.

The condenser lens including the condenser lens center electrode 3 is configured to focus the ion beam B that has been accelerated by the acceleration power supply 10 applying the acceleration voltage Vacc. In this example, the condenser lens center electrode 3 is configured to focus the passing ion beam B with an electric field that is generated through application of a condenser lens voltage Vcl to the condenser lens center electrode 3 by a condenser lens power supply 80 of the lens power supply unit 8.

The beam booster tube 4a is configured to apply a beam booster voltage Vb to the ion beam B focused by the condenser lens. The beam booster tube 4a is provided between the condenser lens center electrode 3 and the objective lens center electrode 5. The beam booster tube 4a is configured to increase potential energy of the ion beam B having passed through the condenser lens, to thereby suppress an increase in amount of beam blur caused by chromatic aberration or expansion of a beam profile caused by the Coulomb interaction. The beam booster tube 4a includes a beam booster 4b. The beam booster 4b includes an alignment electrode 41, an astigmatism correction electrode 42, a blanking electrode 43, a first scanning electrode 44, and a second scanning electrode 45.

The alignment electrode 41 is provided between the condenser lens center electrode 3 and the astigmatism correction electrode 42. The alignment electrode 41 is connected to an alignment power supply 61 of the beam booster control unit 6. The alignment electrode 41 is configured to apply a voltage to the ion beam B, to thereby correct deviation of an optical axis of the passing ion beam B.

The astigmatism correction electrode 42 is provided between the alignment electrode 41 and the blanking electrode 43. The astigmatism correction electrode 42 is connected to an astigmatism correction power supply 62 of the beam booster control unit 6. The astigmatism correction electrode 42 is configured to apply a voltage to the ion beam B, to thereby correct distortion of a sectional shape of the passing ion beam B into perfect circle.

The blanking electrode 43 is provided between the astigmatism correction electrode 42 and the first scanning electrode 44. The blanking electrode 43 is connected to a blanking power supply 63 of the beam booster control unit 6. The blanking electrode 43 is configured to apply a voltage to the ion beam B, to thereby deflect the passing ion beam B so as not to irradiate the sample SP1 with the ion beam B.

The first scanning electrode 44 is provided between the blanking electrode 43 and the second scanning electrode 45. The first scanning electrode 44 is connected to a deflection power supply 64 of the beam booster control unit 6. The first scanning electrode 44 is configured to apply a voltage to the ion beam B, to thereby scan the passing ion beam B on the sample SP1.

The second scanning electrode 45 is provided between the first scanning electrode 44 and the objective lens center electrode 5. The second scanning electrode 45 is connected to the deflection power supply 64 of the beam booster control unit 6. The second scanning electrode 45 is configured to apply a voltage to the ion beam B, to thereby scan the passing ion beam B on the sample SP1.

The objective lens center electrode 5 is provided between the second scanning electrode 45 and the sample table. The objective lens is configured to focus the ion beam B that has been applied with the beam booster voltage Vb by the beam booster 4b so as to irradiate the sample SP1 with the focused ion beam B. In this example, the objective lens is configured to focus the passing ion beam B with an electric field that is generated through application of an objective lens voltage Vol to the objective lens center electrode 5 by an objective lens power supply 81 included in the lens power supply unit 8. Further, the objective lens is configured to decelerate the ion beam B by an amount corresponding to a potential difference of the beam booster.

The beam booster control unit 6 is configured to control the beam booster 4b. The beam booster control unit 6 includes a memory control unit (MCU) 60, the alignment power supply 61, the astigmatism correction power supply 62, the blanking power supply 63, the deflection power supply 64, and a high-voltage floating unit 66.

The MCU 60 is configured to control, based on the beam booster voltage Vb set by the beam booster power supply unit 7, the alignment power supply 61, the astigmatism correction power supply 62, and the blanking power supply 63. The MCU 60 is configured to control the deflection power supply 64 based on a first voltage value EdefU and a second voltage value EdefL, which are set by the control unit 9. The first voltage value EdefU is a value of a first voltage VdefU that is to be applied to the first scanning electrode 44. The second voltage value EdefL is a value of a second voltage VdefL that is to be applied to the second scanning electrode 45.

The alignment power supply 61 is configured to apply a voltage to the alignment electrode 41. The astigmatism correction power supply 62 is configured to apply a voltage to the astigmatism correction electrode 42. The blanking power supply 63 is configured to apply a voltage to the blanking electrode 43. The deflection power supply 64 is configured to apply a voltage to the first scanning electrode 44 and the second scanning electrode 45.

The high-voltage floating unit 66 is configured to supply a scanning signal to the deflection power supply 64 under control of the scan board 16. The scanning signal is a signal for adjusting an irradiation position of the ion beam B on the sample SP1. The high-voltage floating unit 66 forms a scanning system SS together with the scan board 16.

The beam booster power supply unit 7 is configured to set the beam booster voltage Vb based on the control by the control unit 9.

The lens power supply unit 8 includes the condenser lens power supply 80 and the objective lens power supply 81. The condenser lens power supply 80 is configured to apply a voltage to the condenser lens. The objective lens power supply 81 is configured to apply a voltage to the objective lens center electrode 5.

The control unit 9 is configured to control the beam booster power supply unit 7 based on an acceleration voltage value Eacc of the acceleration voltage Vacc supplied from the PC 17. In this example, the acceleration voltage value Eacc is supplied to the control unit 9 from the PC 17 via the host PB unit 13. The control unit 9 is described below in detail.

The PC 17 is configured to receive various operations from a user of the charged particle beam apparatus D1. The PC 17 is configured to supply an operation signal to the ion source control unit 1 via the tank control module 12. The PC 17 is configured to supply an operation signal to the beam booster control unit 6 and the control unit 9 via the host PB unit 13. Here, the operation signal includes, for example, information indicating the acceleration voltage value Eacc being a value of the acceleration voltage Vacc. The PC 17 is also configured to control the vacuum control unit 14 configured to control a vacuum condition of the charged particle beam apparatus D1, and the stage control unit 15 configured to control a stage on which the sample SP1 is to be placed.

In the first embodiment, description is given, by way of example, of a case in which the beam booster voltage Vb set by the beam booster power supply unit 7 is zero. The alignment electrode 41, the astigmatism correction electrode 42, and the blanking electrode 43 included in the beam booster 4b may be omitted. Further, the alignment power supply 61, the astigmatism correction power supply 62, and the blanking power supply 63 included in the beam booster control unit 6 may be omitted. The beam booster power supply unit 7 may be omitted.

Next, the configuration of the control unit 9 is described in detail.

Figure 4:
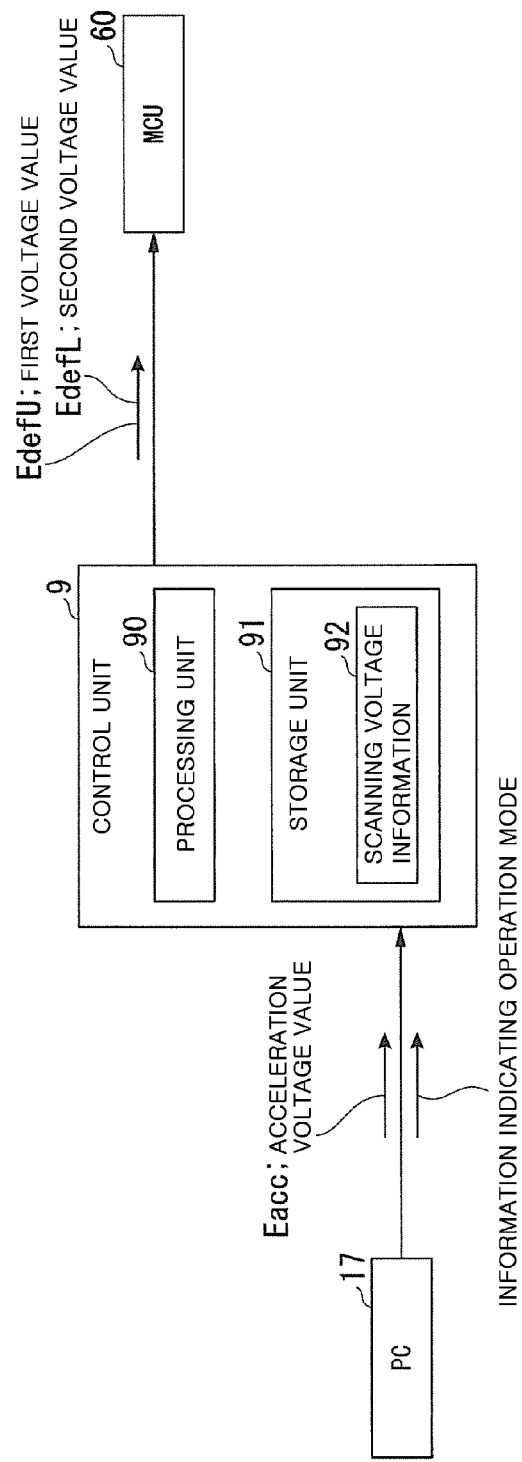
FIG. 4 is a diagram for illustrating a configuration example of a control unit in the charged particle beam apparatus according to the first embodiment.

FIG. 4 is a diagram for illustrating a configuration example of the control unit in the charged particle beam apparatus according to the first embodiment. The control unit 9 includes a processing unit 90 and a storage unit 91. In the storage unit 91, scanning voltage information 92 is stored.

The processing unit 90 is configured to derive the first voltage value EdefU being a value of the first voltage VdefU and the second voltage value EdefL being a value of the second voltage VdefL, from the acceleration voltage value Eacc and information indicating an operation mode supplied from the PC 17, and the scanning voltage information 92 read from the storage unit 91. The processing unit 90 is configured to output the derived first voltage value EdefU and second voltage value EdefL to the MCU 60.

In the scanning voltage information 92, there are stored, for each acceleration voltage value Eacc being a value of the acceleration voltage Vacc, an operation mode and information that specifies the first voltage value EdefU being a value of the first voltage VdefU and the second voltage value EdefL being a value of the second voltage VdefL, in association with each other.

Figures 5, 6:
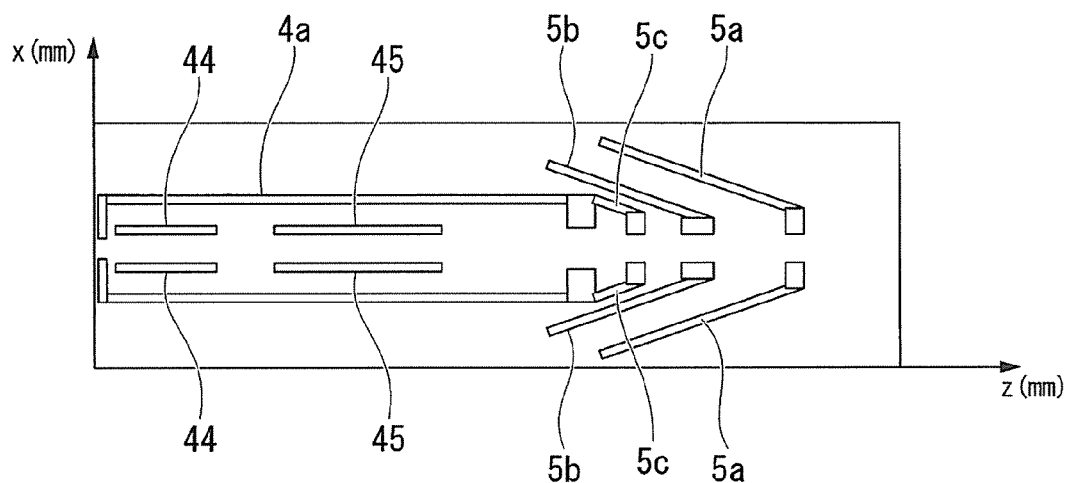
FIG. 5 is a diagram for illustrating an example of scanning voltage information.
FIG. 6 is a view for illustrating an example of a first electrode, a second electrode, an incident side electrode, an intermediate electrode, and an exit side electrode in the charged particle beam apparatus according to the first embodiment.

FIG. 5 is a diagram for illustrating an example of the scanning voltage information. In the example shown in FIG. 5, in the scanning voltage information 92, the operation mode, a ratio between the first voltage value EdefU and the second voltage value EdefL, and the first voltage value EdefU are associated with one another for each of the acceleration voltage values Eacc of 5 kV, 10 kV, and 30 kV. In this case, the operation mode includes an acceleration mode and a deceleration mode. The acceleration mode is an operation mode for accelerating the ion beam B to a higher level than before the ion beam enters the objective lens, and focusing the ion beam in the objective lens. The deceleration mode is an operation mode for decelerating the ion beam B to a lower level than before the ion beam enters the objective lens, and focusing the ion beam in the objective lens. In both modes, at the time of exiting the objective lens, the ion beam is at the same speed as when the ion beam enters the objective lens.

As shown in FIG. 5, in the scanning voltage information 92, there are associated: the acceleration voltage value of "30 kV," the operation mode of "acceleration mode," and the ratio of "1:0.953" between the first voltage value and the second voltage value, and the first voltage value of "210 V"; and the acceleration voltage value of "30 kV," the operation mode of "deceleration mode," the ratio of "1:0.942" between the first voltage value and the second voltage value, and the first voltage value of "228 V." In this case, the acceleration voltage values Eacc of 5 kV, 10 kV, and 30 kV are shown as an example, but the present invention is not limited to this example. The acceleration voltage value Eacc may be any value in addition to 5 kV, 10 kV, and 30 kV. Further, the first voltage value is a value that ensures a particular scanning width on the sample, and is, for example, a value for scanning with a 0.5 mm width.

Here, description is given of processing for causing the ion beam B to pass through the principal surface of the objective lens on the optical axis.

FIG. 6 is a view for illustrating an example of the first scanning electrode, the second scanning electrode, and an incident side electrode, an intermediate electrode, and an exit side electrode that form the objective lens in the charged particle beam apparatus according to the first embodiment. In FIG. 6, there are illustrated the beam booster tube 4*a*, the first scanning electrode 44, the second scanning electrode 45, an incident side electrode 5*c*, an intermediate electrode 5*b*, and an exit side electrode 5*a*. In FIG. 6, a transverse direction of the beam booster tube 4*a* is defined as an X axis, and a longitudinal direction of the beam booster tube 4*a* is defined as a Z axis. Further, a direction on the Z axis from a side from which the ion beam B enters the lens to a side from which the ion beam B exits the lens is defined as a positive direction.

Next, the trajectory of the ion beam B is described.

Figure 7:
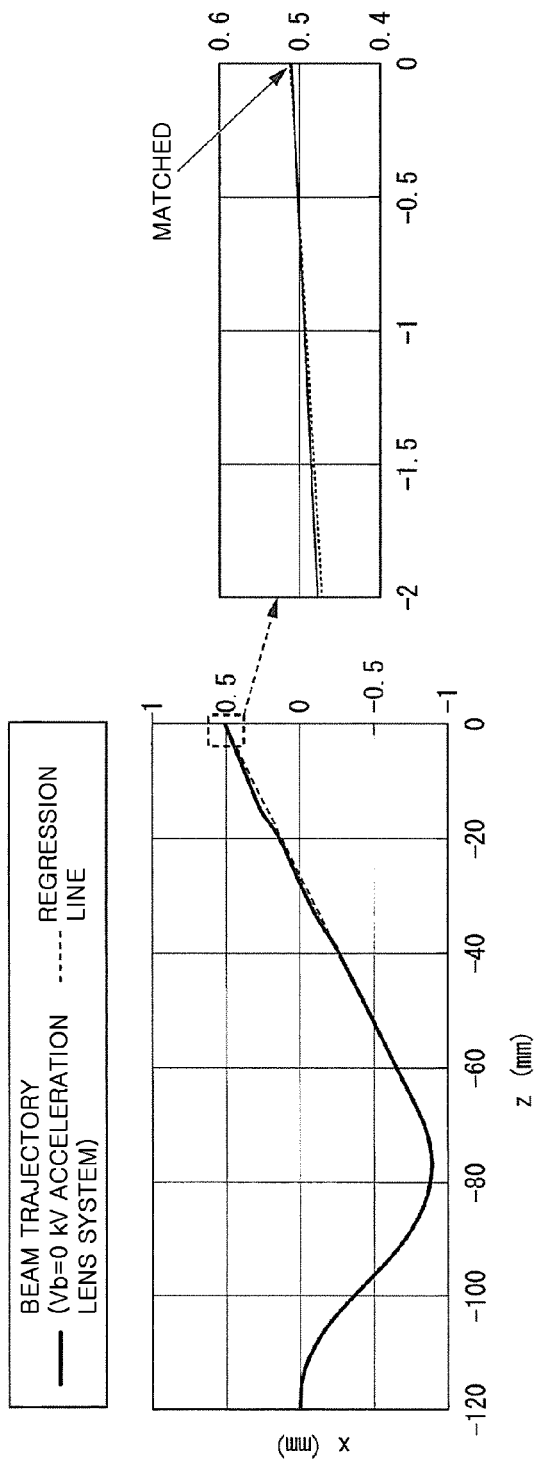
FIG. 7 shows graphs of an example of an ion beam trajectory.

FIG. 7 shows graphs of an example of the ion beam trajectory in the configuration of FIG. 6. In FIG. 7, an X axis and a Z axis are as illustrated in FIG. 6. FIG. 7 shows a case in which the operation mode is the acceleration mode (acceleration lens system), the acceleration voltage is 5 kV, and the beam booster 4*b* is not provided (beam booster voltage value is 0 V).

Although not shown in FIG. 7, there are formed a deflection electric field generated by the first scanning electrode in a region of a Z axis value of from −120 mm to −110 mm, a deflection electric field generated by the second scanning electrode in a region of the Z axis value of from −90 mm to −70 mm, and a focused electric field generated by the objective lens in a region of the Z axis value of from −40 mm to −5 mm. FIG. 7 shows the trajectory of the ion beam B from when the ion beam B enters the first scanning electrode until when the ion beam B reaches the sample surface, and a result of fitting a regression line to the trajectory of the ion beam B.

As can be understood from the left-hand graph of FIG. 7, the trajectory of the ion beam B and the result of fitting the regression line to the trajectory of the ion beam B cross each other at an image plane. That is, it can be understood that the ion beam B passes through the principal surface.

The right-hand graph of FIG. 7 is an enlarged graph of a portion of the left-hand graph of FIG. 7, which shows the trajectory of the ion beam B and the result of fitting the regression line to the trajectory of the ion beam B at Z=0 mm. As shown in the right-hand graph of FIG. 7, when the Z axis value (with respect to sample surface) Z is 0 mm, X is 0.5 mm. The ion beam B can be considered to have the straight trajectory while passing through the focused electric field generated by the objective lens in a region of a Z axis coordinate of from −40 mm to −5 mm.

Thus, the ion beam B reaches the sample surface with little influence of a lens action of the objective lens. The beam passing through the principal surface of the lens on the optical axis travels straight and hence, it can be considered that the trajectory of the ion beam B of FIG. 7 passes through the principal surface of the objective lens.

At this time, a ratio (DEF ratio between upper stage and lower stage) between the first voltage value EdefH and the second voltage value EdefL (first voltage value EdefH: second voltage value EdefL) is 1:0.953.

Assuming that the first voltage value EdefH is 35 V, and the second voltage value EdefL is −33.36 V, the amplitude in the X axis direction of the trajectory of the ion beam B is 0.5 mm. It should be noted here that polarities of the first voltage value and the second voltage value are required to be inverted.

Further, although not shown, also in a Y axis direction being a vertical direction to the drawing sheet, scanning can be performed by applying the first voltage value and the second voltage value to the first scanning electrode and the second scanning electrode, respectively, as with the X axis. An XY plane can be scanned through raster scanning. When the polarities of the first voltage value and the second voltage value are inverted, scanning is performed in an opposite direction on each axis.

With the first voltage value EdefH of 35 V, and the second voltage value EdefL of −33.36 V, the sample surface is scanned by +0.5 mm.

With the first voltage value EdefH of −35 V, and the second voltage value EdefL of 33.36 V, the sample surface is scanned by −0.5 mm. In the above-mentioned example, the scanning is performed in a region of ±0.5 mm, that is, 1 $mm^2$.

The ion beam trajectory was derived also for a case in which the operation mode is the deceleration mode, the acceleration voltage value Eacc is 5 kV, and the beam booster 4b is not provided (beam booster voltage value is 0 V). It was found that when the ratio (DEF ratio between upper stage and lower stage) between the first voltage value EdefH and the second voltage value EdefL (first voltage value EdefH:second voltage value EdefL) is 1:0.942, the trajectory matches the regression line on the sample surface. In order to achieve the amplitude of 0.5 mm (FOV=1 mm) (field of view of scanned image: 1 mm$^2$) for the trajectory of the ion beam B in the X axis direction, the first voltage value EdefH is set to 38 V.

The scanning voltage information 92 of FIG. 5 is derived from the above-mentioned values.

Next, description is given of processing for setting the first voltage value EdefU and the second voltage value EdefL based on the acceleration voltage and the operation mode in relation to the operation of the charged particle beam apparatus.

Figure 8:
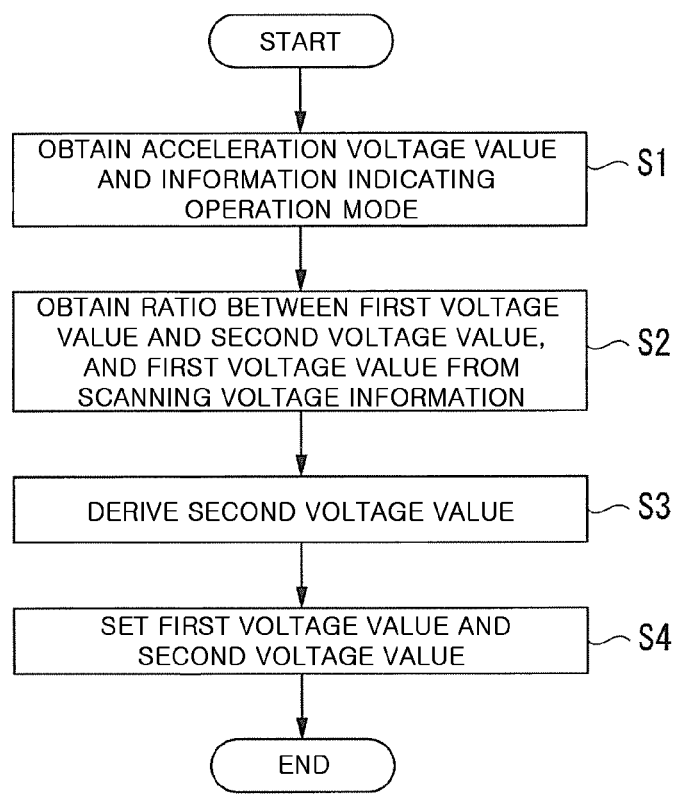
FIG. 8 is a flow chart for illustrating an operation example of the charged particle beam apparatus according to the first embodiment.

FIG. 8 is a flow chart for illustrating an operation example of the charged particle beam apparatus according to the first embodiment.

(Step S1)

In the charged particle beam apparatus D1, the processing unit 90 obtains from the PC 17 the acceleration voltage value Eacc and information indicating the operation mode.

(Step S2)

In the charged particle beam apparatus D1, the processing unit 90 reads out the scanning voltage information 92 from the storage unit 91. The processing unit 90 obtains, from the read scanning voltage information 92, a ratio between the first voltage value and the second voltage value, and a first voltage value, which are associated with a combination of the obtained acceleration voltage value Eacc and the obtained information indicating the operation mode.

(Step S3)

In the charged particle beam apparatus D1, the processing unit 90 derives a second voltage value based on the obtained ratio between the first voltage value and the second voltage value, and the obtained first voltage value.

(Step S4)

In the charged particle beam apparatus D1, the processing unit 90 sets the first voltage value and the derived second voltage value in the MCU 60. It should be noted here that the polarities of the first voltage value and the second voltage value are required to be inverted.

Further, the first voltage value is a value that ensures a particular scanning width on the sample and, for example, is a value for scanning with a 0.5 mm width. Further, when the polarities of the first voltage value and the second voltage value are inverted, scanning is performed in an opposite direction.

In and after Step S4, the scanning width can be changed to any value. For example, in a case of scanning with a 0.1 mm width, it is only required to reduce the first voltage value and the second voltage value to 1/5. The first voltage value and the second voltage value are changed based on the ratio between the first voltage value and the second voltage value, and hence a precise scanned image with no distortion can be obtained.

The foregoing description of the first embodiment is given of the case in which, in the scanning voltage information 92, the acceleration voltage value, the information indicating the operation mode, the information indicating the ratio between the first voltage value and the second voltage value, and the first voltage value are stored in association with one another. However, the present invention is not limited to this example. For example, in the scanning voltage information 92, the acceleration voltage value, the information indicating the operation mode, the information indicating the ratio between the first voltage value and the second voltage value, and the second voltage value may be stored in association with one another. Alternatively, in the scanning voltage information 92, the acceleration voltage value, the information indicating the operation mode, the first voltage value, and the second voltage value may be stored in association with one another.

The foregoing description of the first embodiment is given of the case in which the control unit 9 includes the storage unit 91, but the present invention is not limited to this example. For example, the storage unit 91 may be provided outside the charged particle beam apparatus D1. When the storage unit 91 is provided outside the charged particle beam apparatus D1, for example, the storage unit 91 may be provided as an external storage device or a cloud server as well.

Further, instead of storing the scanning voltage information 92 in the storage unit 91, the storage unit 91 may store therein calculation expressions for deriving the first scanning voltage VdefU and the second scanning voltage VdefL based on the acceleration voltage value Eacc and the information indicating the operation mode. In this case, the control unit 9 may derive and set the first scanning voltage VdefU and the second scanning voltage VdefL based on the calculation expressions.

In the first embodiment described above, the information included in the scanning voltage information 92 may be partially omitted. For example, such information that the acceleration voltage is 5 kV and the operation mode is the deceleration mode is rarely used and hence can be omitted. In contrast, any information can be added to the scanning voltage information 92.

The charged particle beam apparatus D1 according to the first embodiment includes: a charged particle source (in the first embodiment, ion emitter E) configured to generate charged particles; a plurality of scanning electrodes configured to generate electric fields for deflecting charged particles that are emitted by applying an acceleration voltage to the charged particle source and applying an extraction voltage to an extraction electrode configured to extract the charged particles; an electrostatic lens (in the first embodiment, objective lens), which is provided between the plurality of scanning electrodes and a sample table, and is configured to focus a charged particle beam scanned with a scanning voltage; and a processing unit configured to obtain measurement conditions (in this case, acceleration voltage value Eacc and operation mode) and set each of a plurality of scanning voltages based on the obtained measurement conditions.

With this configuration, even when a measurement condition is changed, and then the principal surface position of the electrostatic lens is changed, each of the plurality of scanning voltages can be set based on the changed measurement condition (in this case, operation mode), and hence the trajectory of the ion beam B can be changed. Thus, the lens action that may be exerted on the scanned beam can be reduced.

Modification Example 1 of First Embodiment

The configuration of FIG. 3 can be applied to the configuration of a charged particle beam apparatus according to Modification Example 1 of the first embodiment. The charged particle beam apparatus according to Modification Example 1 of the first embodiment differs from the charged particle beam apparatus D1 according to the first embodiment in that the beam booster voltage Vb is applied to the ion beam B. That is, in the configuration of the charged particle beam apparatus described with reference to FIG. 3, the alignment electrode 41, the astigmatism correction electrode 42, and the blanking electrode 43 included in the beam booster 4b are not omitted. Further, the alignment power supply 61, the astigmatism correction power supply 62, and the blanking power supply 63 included in the beam booster control unit 6 are not omitted. The beam booster power supply unit 7 is not omitted. It should be noted that in the charged particle beam apparatus according to Modification Example 1 of the first embodiment, the operation mode is not changed. The charged particle beam apparatus according to Modification Example 1 of the first embodiment includes a control unit 9a in place of the control unit 9.

The configuration of the control unit 9a is described in detail.

Figure 9:
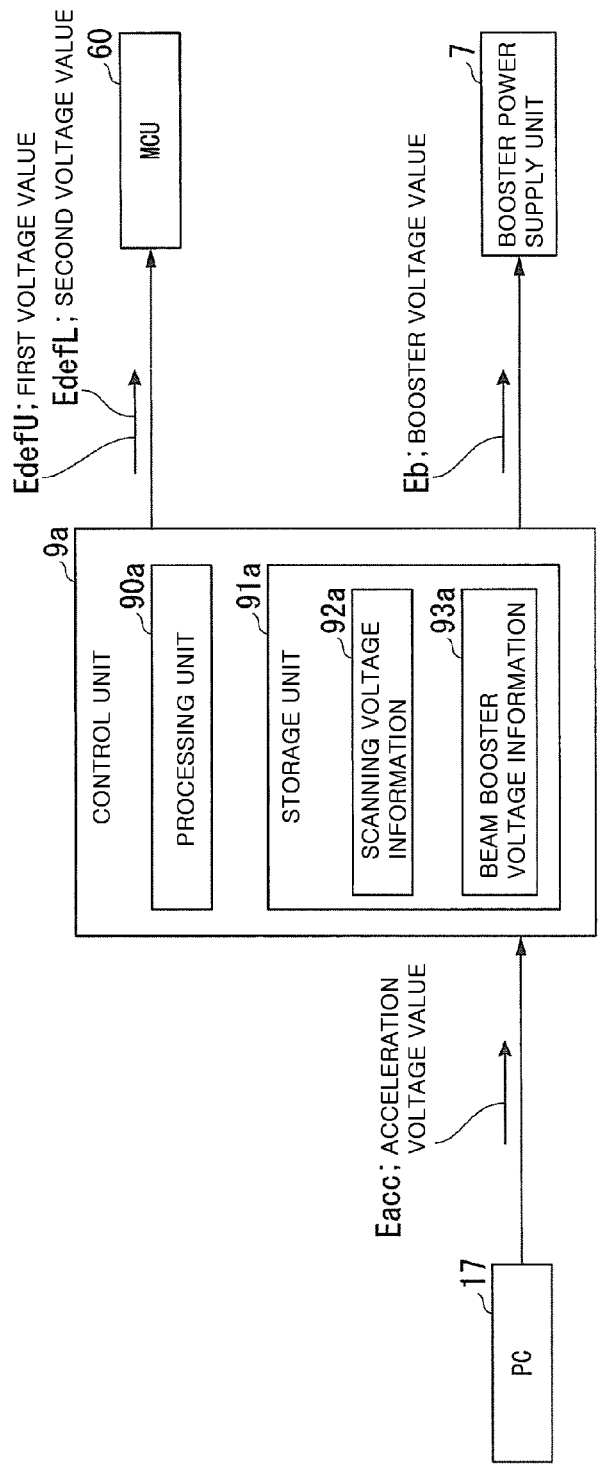
FIG. 9 is a diagram for illustrating a configuration example of a control unit in a charged particle beam apparatus according to Modification Example 1 of the first embodiment.

FIG. 9 is a diagram for illustrating a configuration example of the control unit in the charged particle beam apparatus according to Modification Example 1 of the first embodiment. The control unit 9a includes a processing unit 90a and a storage unit 91a. In the storage unit 91a, scanning voltage information 92a and beam booster voltage information 93a are stored.

The processing unit 90a is configured to derive a beam booster voltage value Eb being a value of the beam booster voltage Vb based on the acceleration voltage value Eacc supplied from the PC 17 and the beam booster voltage information 93a read out from the storage unit 91a. The processing unit 90a is configured to supply the calculated beam booster voltage value Eb to the beam booster power supply unit 7.

The processing unit 90a is configured to derive the first voltage value EdefU being a value of the first voltage VdefU and the second voltage value EdefL being a value of the second voltage VdefL based on the acceleration voltage value Eacc supplied from the PC 17 and the derived beam booster voltage value Eb. The processing unit 90a is configured to output the derived first voltage value EdefU and second voltage value EdefL to the MCU 60.

The scanning voltage information 92a is information having a table format in which the acceleration voltage value Eacc, the beam booster voltage value Eb, information indicating a ratio between the first voltage value EdefU and the second voltage value EdefL, and the first voltage value EdefU are associated with one another.

Figures 10, 11:
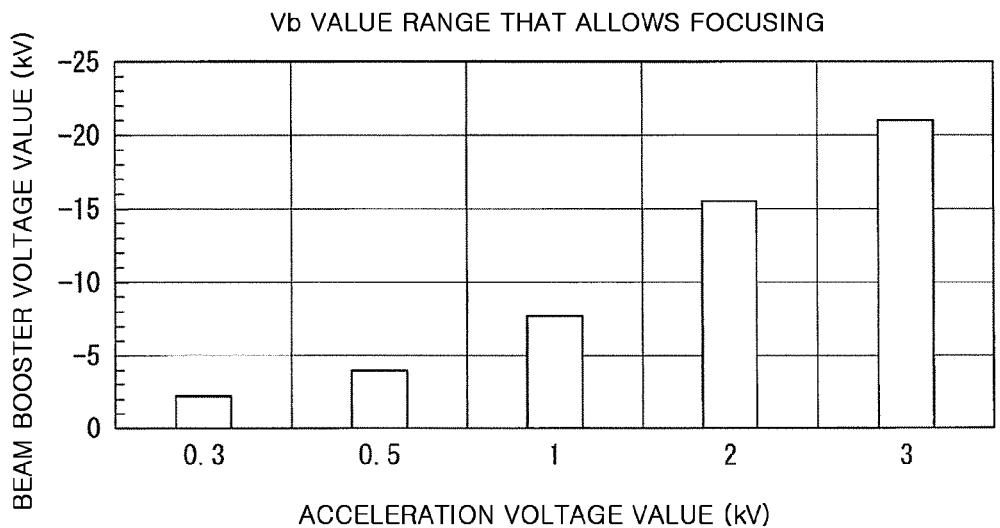
FIG. 10 is a diagram for illustrating an example of scanning voltage information.
FIG. 11 is a graph for showing an example of a relationship between an acceleration voltage value Eacc and a range of a beam booster voltage value Eb in the charged particle beam apparatus according to Modification Example 1 of the first embodiment.

FIG. 10 is a diagram for illustrating an example of scanning voltage information. In the example shown in FIG. 10, in the scanning voltage information 92a, information indicating the operation mode and information indicating the principal surface position are associated with one another in addition to the acceleration voltage value Eacc (kV), the beam booster voltage value Eb (kV), the information indicating a ratio between the first voltage value EdefU and the second voltage value EdefL, and the first voltage value EdefU (V). In this example, the principal surface position is a Z-axis position of the principal surface. As shown in FIG. 10, in the scanning voltage information 92a, the acceleration voltage value of "30 kV," the operation mode of "deceleration mode," the beam booster voltage value of "0 kV," the principal surface position of "−24.6 mm," the ratio of "1:0.942" between the first voltage and the second voltage, and the first voltage of "228 V" are associated with one another. Further, in the scanning voltage information 92a, the acceleration voltage value of "1 kV," the operation mode of "acceleration mode," the beam booster voltage value of "−5 kV," the principal surface position of "−29.0 mm," the ratio of "1:0.986" between the first voltage and the second voltage, and the first voltage of "35.5 V" are associated with one another. Further, in the scanning voltage information 92a, the acceleration voltage value of "5 kV," the operation mode of "acceleration mode," the beam booster voltage value of "−5 kV," the principal surface position of "−23.7 mm," the ratio of "1:0.937" between the first voltage and the second voltage, and the first voltage of "80 V" are associated with one another. In FIG. 10, the principal surface position may be omitted out of the information included in the scanning voltage information 92a.

The beam booster voltage information 93a is set for each acceleration voltage value Eacc. Assuming that the focused ion beam and the electron beam are used to form a composite charged particle beam apparatus, the beam booster voltage value is limited for each acceleration voltage in order to focus the beams at a cross point (coincidence point) between the two beams (focused ion beam and electron beam). An example thereof is shown in FIG. 11. FIG. 11 shows a relationship between the acceleration voltage value (kV) and the beam booster voltage value (kV). As the acceleration voltage is decreased, the beam booster voltage value is decreased. In a case of a single-beam apparatus, the above-mentioned limitation is not imposed.

The processing unit 90a is configured to, when the acceleration voltage value Eacc of the acceleration voltage Vacc is switched, change the beam booster voltage value Eb to a voltage value that is equal to or less than a beam booster voltage set value TEb indicated by the beam booster voltage information 93a. In the beam booster voltage information 93a, an upper limit of the beam booster voltage Vb is stored. After setting the beam booster voltage value Eb, the processing unit 90a may store the acceleration voltage value Eacc and the set beam booster voltage value Eb in association with each other in the beam booster voltage information 93a. The next time the processing unit 90a sets the beam booster voltage Vb, the processing unit 90a may derive the beam booster voltage value Eb based on the beam booster voltage value Eb stored in association with the acceleration voltage value Eacc.

Next, the trajectory of the ion beam B is described.

Figure 12:
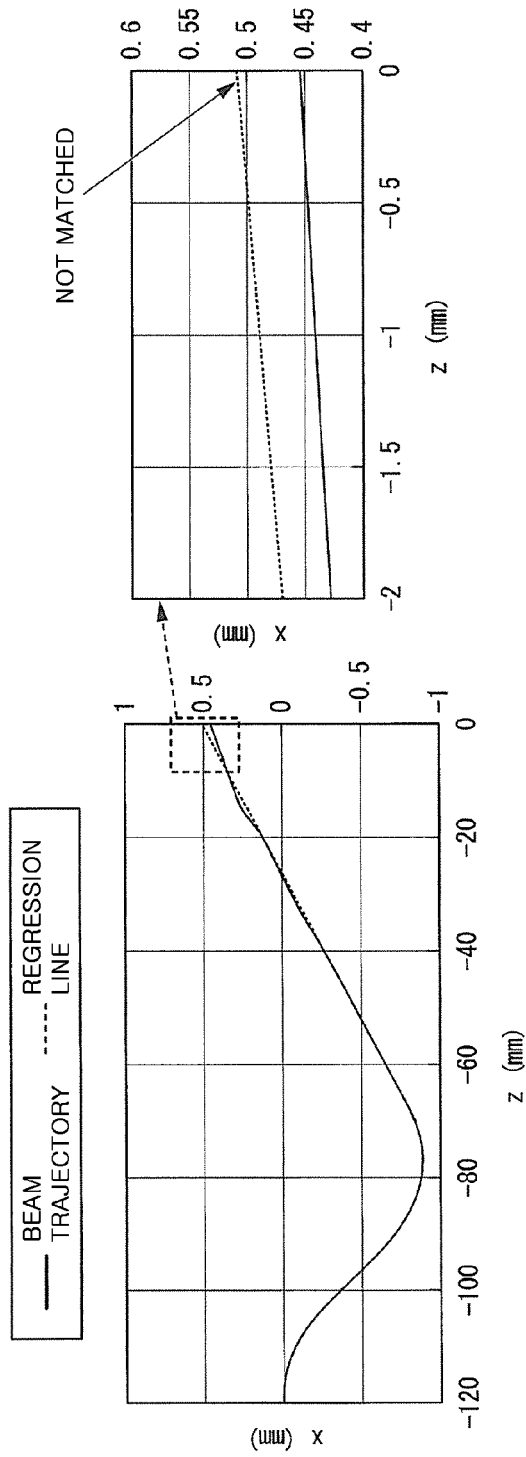
FIG. 12 shows graphs of an example of an ion beam trajectory.

FIG. 12 shows graphs of an example of the ion beam trajectory. In FIG. 12, an X axis and a Z axis are as illustrated in FIG. 6. FIG. 12 shows a case in which the acceleration voltage value Eacc is 5 kV and the beam booster voltage value Eb is 5 kV. The beam booster voltage value Eb is 5 kV, and hence the acceleration energy of the ion beam in the beam booster tube is 10 keV. The scanning voltage is set twice higher than a value obtained when the beam booster voltage is 0 kV. In this example, it is assumed, by way of example, that the first scanning voltage value EdefU is 70 V, and the second scanning voltage value EdefL is 66.71 V. In this case, the ratio of "first scanning voltage value EdefU: second scanning voltage value EdefL" is 1:0.953. This ratio gives such a trajectory along which the ion beam B can be considered to pass through the principal surface of the objective lens when the beam booster voltage is 0 kV.

FIG. 12 shows the trajectory of the ion beam B from when the ion beam B enters the first scanning electrode until when the ion beam B reaches the sample surface, and a result of fitting a regression line to the trajectory of the ion beam B.

As shown in the left-hand graph of FIG. 12, the trajectory of the ion beam B and the result of fitting the regression line to the trajectory of the ion beam B do not match each other on an image plane. This is supposedly because the ion beam B undergoes the lens action in the electric field of the objective lens and thus deviates from the linear trajectory. Although the beam passing through the principal surface of the lens on the optical axis travels straight, the ion beam B deviates from the linear trajectory in this example, and hence it is considered that the ion beam B does not pass through the principal surface of the objective lens. This suggests that when the beam booster voltage Vb is changed, the deviation of the principal surface position occurs.

The right-hand graph of FIG. 12 is an enlarged graph of a portion of the left-hand graph of FIG. 12, which shows the trajectory of the ion beam B and a result of fitting a regression line to the trajectory of the ion beam B at Z=0 mm. As shown in the right-hand graph of FIG. 12, in the trajectory of the ion beam B, when the Z axis value (with respect to sample surface) Z is 0 mm, Z is 0 mm at a position smaller than X=0.45 mm. That is, the amplitude in the X axis direction of the trajectory of the ion beam B is smaller than 0.5 mm. This is supposedly due to de-scanning by the lens action. That is, in this case, it is suggested that the scanning width is 10% short due to the lens action, and the measurement of the dimension of the scanned image results in an inaccurate value.

In Modification Example 1 of the first embodiment, in order to reduce the influence of a lens action resulting from deviation of the principal surface position caused by changing the beam booster voltage Vb, the scanning voltage value Edef is adjusted.

Figure 13:
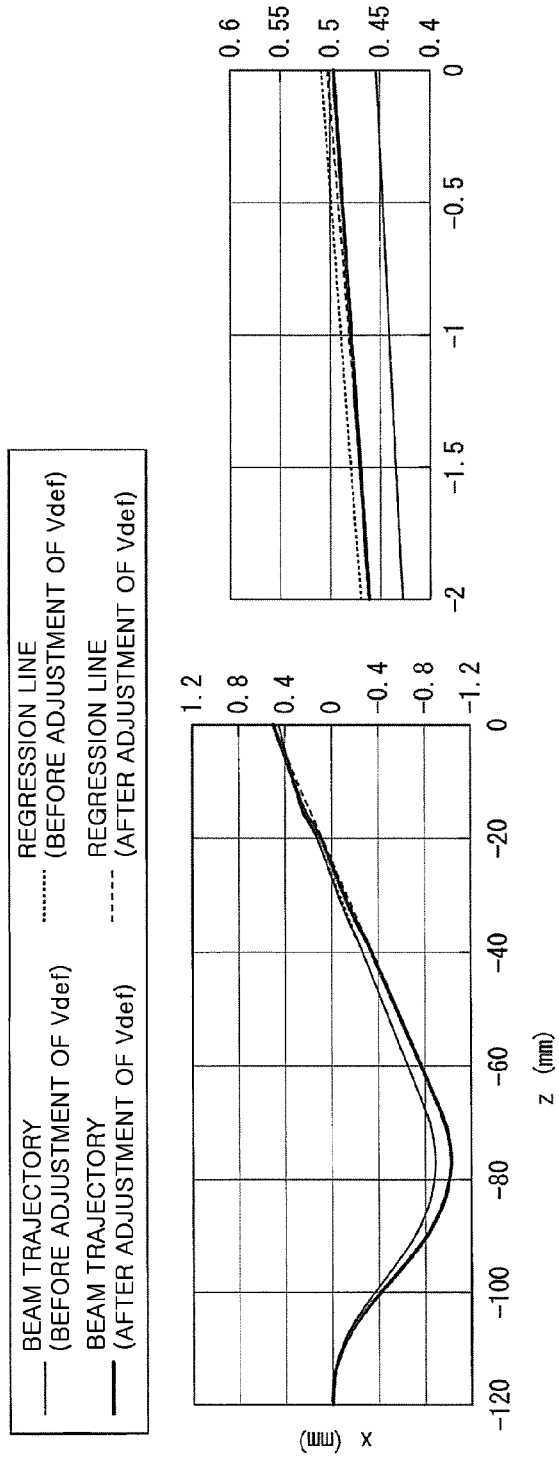
FIG. 13 shows graphs of an example of an ion beam trajectory.

FIG. 13 shows graphs of an example of the ion beam trajectory. In FIG. 13, an X axis and a Z axis are as illustrated in FIG. 6. FIG. 13 shows a case in which the operation mode is the acceleration mode, the acceleration voltage value Eacc is 5 kV, and the beam booster voltage value Eb is 5 kV.

In this example, it is assumed, by way of example, that the first scanning voltage value EdefU is 80 V, and the second scanning voltage value EdefL is 74.94 V. In this case, the ratio of "first scanning voltage value EdefU:second scanning voltage value EdefL" is 1:0.937.

FIG. 13 shows the trajectory of the ion beam B from when the ion beam B enters the first scanning electrode until when the ion beam B reaches the sample surface, and a result of fitting a regression line to the trajectory of the ion beam B before and after adjustment of the scanning voltage value Edef.

As can be understood from the left-hand graph of FIG. 13, the trajectory of the ion beam B and the result of fitting the regression line to the trajectory of the ion beam B cross each other at the image plane. That is, the trajectory of the ion beam B can be approximated with the straight line and considered to be free from the lens action, and thus can be considered to pass through the principal surface.

The right-hand graph of FIG. 13 is an enlarged graph of a portion of the left-hand graph of FIG. 13, which shows a result of fitting the regression line to the trajectory of the ion beam B at Z=0 mm. As can be understood from the right-hand graph of FIG. 13, after the adjustment of the scanning voltage value Edef, Z is 0 mm at X=0.5 mm.

The scanning voltage information 92a of FIG. 10 is derived from the foregoing.

Next, processing for setting the beam booster voltage value Eb, the first voltage value EdefU, and the second voltage value EdefL is described in relation to an operation of the charged particle beam apparatus.

Figure 14:
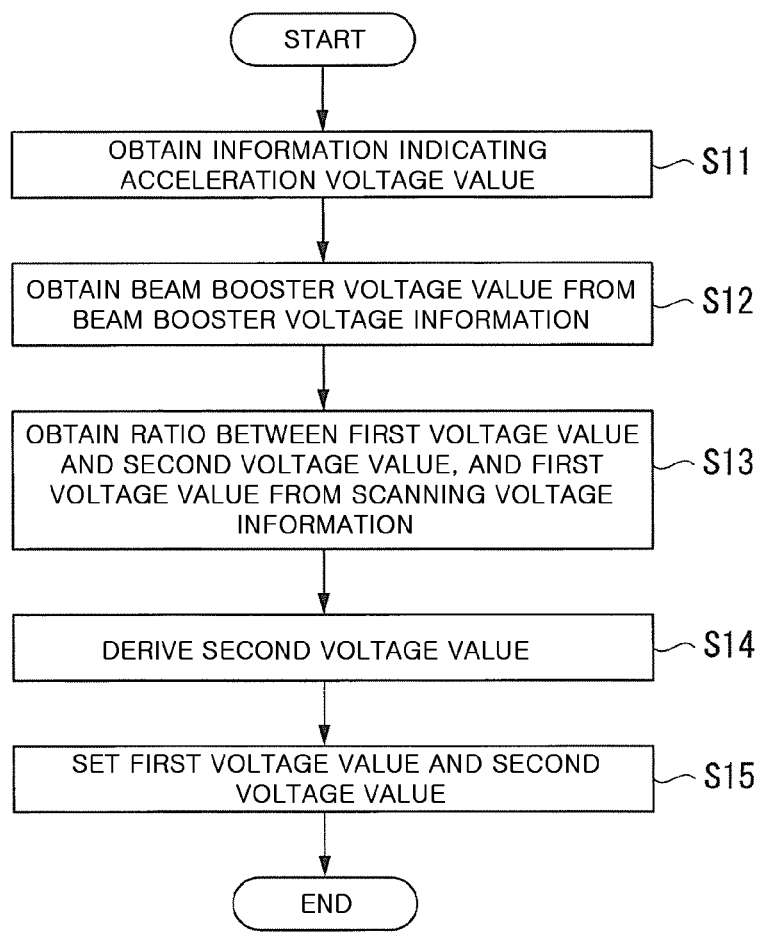
FIG. 14 is a flow chart for illustrating an operation example of the charged particle beam apparatus according to Modification Example 1 of the first embodiment.

FIG. 14 is a flow chart for illustrating an operation example of the charged particle beam apparatus according to Modification Example 1 of the first embodiment.

(Step S11)
In the charged particle beam apparatus D1, the processing unit 90a obtains the acceleration voltage value Eacc from the PC 17.

(Step S12)
In the charged particle beam apparatus D1, the processing unit 90a reads out the beam booster voltage information 93a from the storage unit 91a. The processing unit 90a obtains, from the read beam booster voltage information 93a, the beam booster voltage value Eb associated with the obtained acceleration voltage value Eacc.

(Step S13)
In the charged particle beam apparatus D1, the processing unit 90a reads out the scanning voltage information 92a from the storage unit 91a. The processing unit 90a obtains, from the read scanning voltage information 92a, a ratio between the first voltage value and the second voltage value and a first voltage value associated with a combination of the acceleration voltage value Eacc and the obtained beam booster voltage value Eb.

(Step S14)
In the charged particle beam apparatus D1, the processing unit 90a derives a second voltage value based on the obtained ratio between the first voltage value and the second voltage value, and the obtained first voltage value.

(Step S15)
In the charged particle beam apparatus D1, the processing unit 90a sets the first voltage value and the derived second voltage value in the MCU 60. It should be noted here that the polarities of the first voltage value and the second voltage value are required to be inverted.

Further, the first voltage value is a value that ensures a particular scanning width on the sample, and is, for example, a value for scanning with a 0.5 mm width. Further, when the polarities of the first voltage value and the second voltage value are inverted, scanning is performed in an opposite direction.

After setting the first voltage value and the second voltage value in the MCU 60 in Step S15, the first voltage value and the second voltage value can be changed based on the ratio between the first voltage value and the second voltage value, to thereby change a scanning range to a desired range. The first voltage value and the second voltage value are changed based on the ratio between the first voltage value and the second voltage value, and hence a precise scanned image with no distortion can be obtained.

The charged particle beam apparatus D1 according to Modification Example 1 of the first embodiment includes: a charged particle source (in Modification Example 1 of the first embodiment, ion emitter E) configured to generate charged particles; a plurality of scanning electrodes configured to generate electric fields for deflecting charged particles that are emitted by applying an acceleration voltage to the charged particle source and applying an extraction voltage to an extraction electrode configured to extract the charged particles; an electrostatic lens (in Modification Example 1 of the first embodiment, objective lens), which is provided between the plurality of scanning electrodes and a sample table, and is configured to focus the charged particle beam scanned with a scanning voltage; and a processing unit configured to obtain measurement conditions (in this case, acceleration voltage value Eacc and beam booster voltage value Eb) and set each of a plurality of scanning voltages based on the obtained measurement conditions and information that specifies a position of a principal surface of the electrostatic lens.

With this configuration, even when a measurement condition (in this example, beam booster voltage value Eb) is changed, and a position of the principal surface of the electrostatic lens is changed, each of the plurality of scanning voltages can be set based on the changed measurement condition, and hence the trajectory of the ion beam B can be changed. Thus, the lens action that may be exerted on the scanned beam can be reduced.

Modification Example 2 of First Embodiment

The configuration of FIG. 3 can be applied to the configuration of a charged particle beam apparatus according to Modification Example 2 of the first embodiment. The charged particle beam apparatus according to Modification Example 2 of the first embodiment differs from the charged particle beam apparatus D1 according to the first embodiment in that the beam booster voltage Vb is applied to the ion beam B. That is, in the configuration of the charged particle beam apparatus described with reference to FIG. 3, the alignment electrode 41, the astigmatism correction electrode 42, and the blanking electrode 43 included in the beam booster 4b are not omitted. Further, the alignment power supply 61, the astigmatism correction power supply 62, and the blanking power supply 63 included in the beam booster control unit 6 are not omitted. The beam booster power supply unit 7 is not omitted. The charged particle beam apparatus according to Modification Example 2 of the first embodiment includes a control unit 9b in place of the control unit 9.

The configuration of the control unit 9b is described in detail.

Figure 15:
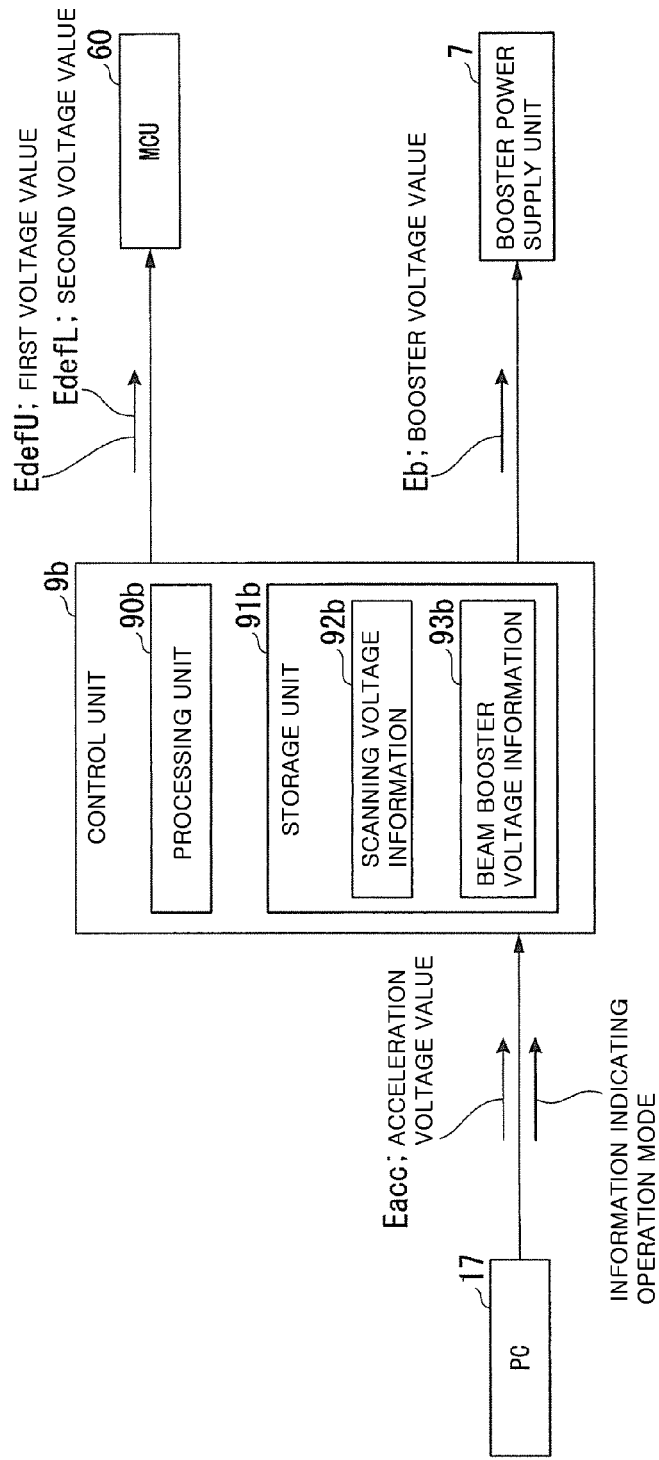
FIG. 15 is a diagram for illustrating a configuration example of a control unit in a charged particle beam apparatus according to Modification Example 2 of the first embodiment.

FIG. 15 is a diagram for illustrating a configuration example of the control unit 9b in the charged particle beam apparatus according to Modification Example 2 of the first embodiment. The control unit 9b includes a processing unit 90b and a storage unit 91b. In the storage unit 91b, scanning voltage information 92b and beam booster voltage information 93b are stored.

The processing unit 90b is configured to derive the beam booster voltage value Eb being a value of the beam booster voltage Vb based on the acceleration voltage value Eacc supplied from the PC 17 and the beam booster voltage information 93b read out from the storage unit 91a. The processing unit 90b is configured to supply the calculated beam booster voltage value Eb to the beam booster power supply unit 7.

The processing unit 90b is configured to derive the first voltage value EdefU being a value of the first voltage VdefU and the second voltage value EdefL being a value of the second voltage VdefL based on the acceleration voltage value Eacc supplied from the PC 17, the information indicating the operation mode, and the derived beam booster voltage value Eb. The processing unit 90b is configured to output the derived first voltage value EdefU and second voltage value EdefL to the MCU 60.

The scanning voltage information 92b is information having a table format in which the acceleration voltage value Eacc, information indicating the operation mode, the beam booster voltage value Eb, information indicating a ratio between the first voltage value EdefU and the second voltage value EdefL, and the first voltage value EdefU are associated with one another.

As an example of the scanning voltage information 92b, the scanning voltage information 92a can be applied, and as the beam booster voltage information 93b, the beam booster voltage information 93a can be applied.

Next, processing for setting the beam booster voltage value Eb, the first voltage value EdefU, and the second voltage value EdefL is described in relation to an operation of the charged particle beam apparatus.

Figure 16:
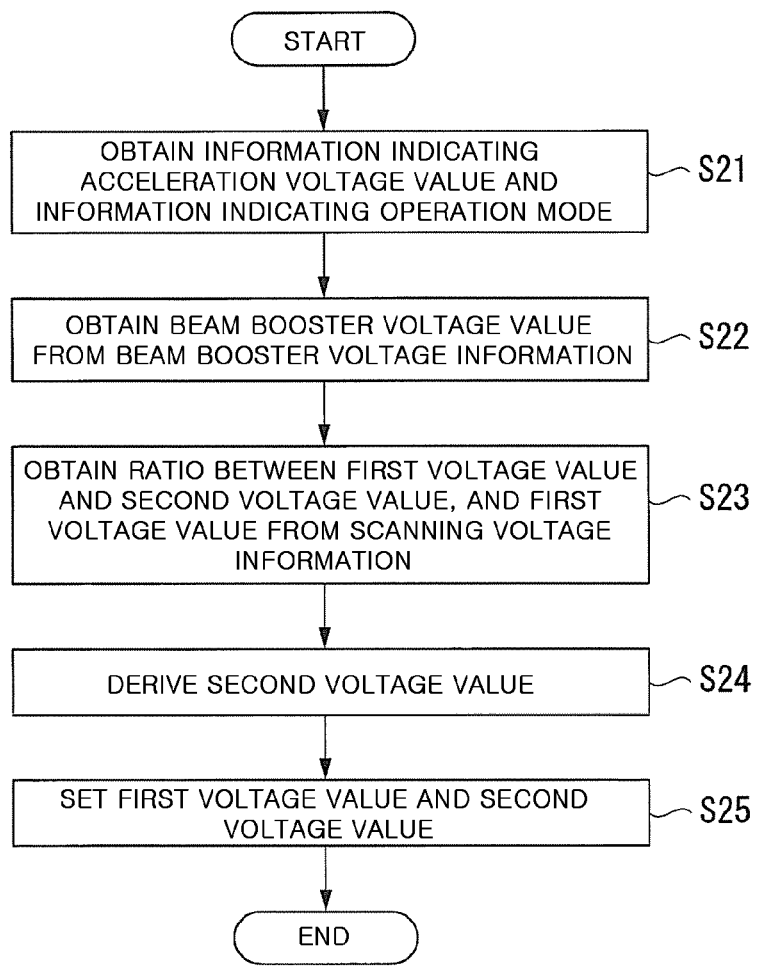
FIG. 16 is a flow chart for illustrating an operation example of the charged particle beam apparatus according to Modification Example 2 of the first embodiment.

FIG. 16 is a flow chart for illustrating an operation example of the charged particle beam apparatus according to Modification Example 2 of the first embodiment.

(Step S21)

In the charged particle beam apparatus D1, the processing unit 90b obtains, from the PC 17, the acceleration voltage value Eacc and information indicating the operation mode.

(Step S22)

In the charged particle beam apparatus D1, the processing unit 90b reads out from the storage unit 91b the beam booster voltage information 93b. The processing unit 90b obtains, from the read beam booster voltage information 93b, the beam booster voltage value Eb associated with the obtained acceleration voltage value Eacc.

(Step S23)

In the charged particle beam apparatus D1, the processing unit 90b reads out the scanning voltage information 92b from the storage unit 91b. The processing unit 90b obtains, from the read scanning voltage information 92b, a ratio between the first voltage value and the second voltage value and a first voltage value associated with a combination of the acceleration voltage value Eacc, the information indicating the operation mode, and the obtained beam booster voltage value Eb.

(Step S24)

In the charged particle beam apparatus D1, the processing unit 90b derives a second voltage value based on the obtained ratio between the first voltage value and the second voltage value, and the obtained first voltage value.

(Step S25)

In the charged particle beam apparatus D1, the processing unit 90b sets the first voltage value and the derived second voltage value in the MCU 60. It should be noted here that the polarities of the first voltage value and the second voltage value are required to be inverted.

Further, the first voltage value is a value that ensures a particular scanning width on the sample, and is, for example, a value for scanning with a 0.5 mm width. Further, when the polarities of the first voltage value and the second voltage value are inverted, scanning is performed in an opposite direction.

After the first voltage value and the second voltage value are set in the MCU 60 in Step S25, the first voltage value and the second voltage value can be changed based on the ratio between the first voltage value and the second voltage value, to thereby change a scanning range to a desired range. The first voltage value and the second voltage value are changed based on the ratio between the first voltage value and the second voltage value, and hence a precise scanned image with no distortion can be obtained.

The charged particle beam apparatus D1 according to Modification Example 2 of the first embodiment includes: a charged particle source (in Modification Example 2 of the first embodiment, ion emitter E) configured to generate charged particles; a plurality of scanning electrodes configured to generate electric fields for deflecting charged particles that are emitted by applying an acceleration voltage to the charged particle source and applying an extraction voltage to an extraction electrode configured to extract the charged particles; an electrostatic lens (in Modification Example 2 of the first embodiment, objective lens), which is provided between the plurality of scanning electrodes and a sample table, and is configured to focus the charged particle beam scanned with a scanning voltage; and a processing unit configured to obtain measurement conditions (in this case, acceleration voltage value Eacc, beam booster voltage value Eb, and information indicating operation mode) and set each of a plurality of scanning voltages based on the obtained measurement conditions and information that specifies a position of a principal surface of the electrostatic lens.

With this configuration, even when one of the measurement conditions (in this example, acceleration voltage value Eacc, beam booster voltage value Eb, and information indicating operation mode) is changed, and a position of the principal surface of the electrostatic lens is changed, each of the plurality of scanning voltages can be set based on the changed measurement condition, and hence the trajectory of the ion beam B can be changed. Thus, the lens action that may be exerted on the scanned beam can be reduced.

Second Embodiment

A composite charged particle beam apparatus D according to a second embodiment of the present invention includes a scanning electron microscope D2 (not shown), for example, an electron beam column, in addition to the charged particle beam apparatus D1 described with reference to FIG. 3. Here, the alignment electrode 41, the astigmatism correction electrode 42, and the blanking electrode 43 included in the beam booster 4b are not omitted. Further, the alignment power supply 61, the astigmatism correction power supply 62, and the blanking power supply 63 included in the beam booster control unit 6 are not omitted. The beam booster power supply unit 7 is not omitted.

The scanning electron microscope D2 is configured to irradiate the sample SP1 with an electron beam and detect secondary electrons emitted from, or electrons reflected by, the sample SP1, to thereby observe the surface or cross section of the sample SP1.

The composite charged particle beam apparatus D according to the second embodiment is configured to apply the electron beam and the focused ion beam to the same position on the sample. In order to apply the electron beam and the focused ion beam to the same position on the sample, focus positions of the electron beam and the focused ion beam are required to match each other at the same position (irradiation position) on the sample. The same position on the sample irradiated with the electron beam and the focused ion beam is referred to as "coincidence point (CP)."

The composite charged particle beam apparatus according to the second embodiment includes a control unit 9c in place of the control unit 9.

The configuration of the control unit 9c is described in detail.

Figure 17:
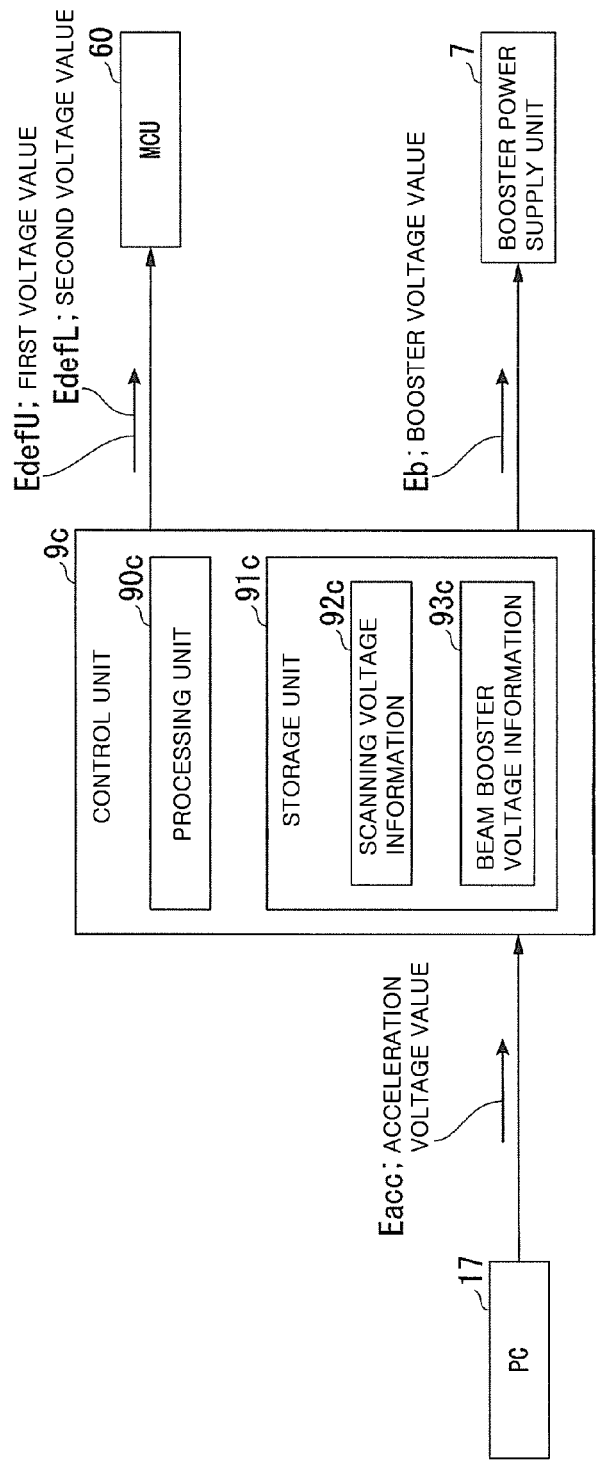
FIG. 17 is a diagram for illustrating a configuration example of a control unit in a composite charged particle beam apparatus according to a second embodiment of the present invention.

FIG. 17 is a diagram for illustrating a configuration example of the control unit 9c in the composite charged particle beam apparatus according to the second embodiment. The control unit 9c includes a processing unit 90c and a storage unit 91c. In the storage unit 91c, scanning voltage information 92c and beam booster voltage information 93c are stored.

The processing unit 90c is configured to derive the beam booster voltage value Eb being a value of the beam booster voltage Vb based on the acceleration voltage value Eacc supplied from the PC 17 and the beam booster voltage information 93c read out from the storage unit 91c. The processing unit 90c is configured to supply the calculated beam booster voltage value Eb to the beam booster power supply unit 7.

The processing unit 90c is configured to derive the first voltage value EdefU being a value of the first voltage VdefU and the second voltage value EdefL being a value of the second voltage VdefL based on the acceleration voltage value Eacc supplied from the PC 17 and the derived beam booster voltage value Eb. The processing unit 90c outputs the derived first voltage value EdefU and second voltage value EdefL to the MCU 60.

The scanning voltage information 92c is information having a table format in which the acceleration voltage value Eacc, the beam booster voltage value Eb, information indicating a ratio between the first voltage value EdefU and the second voltage value EdefL, and the first voltage value EdefU are associated with one another.

As an example of the scanning voltage information 92c, the scanning voltage information 92a described with reference to FIG. 10 can be applied.

The beam booster voltage information 93c is information having a table format in which the acceleration voltage value Eacc and the beam booster voltage set value TEb, which is calculated in advance in accordance with a desired focal length, are associated with each other. Specifically, the beam booster voltage set value TEb is a voltage value in a range that allows the electron beam and the focused ion beam to be focused onto the same position, that is, CP on the sample when the acceleration voltage value Eacc is applied. The fine adjustment of the focus position is performed as in the related art by adjusting the voltage applied to the objective lens. In the composite charged particle beam apparatus D, the beam booster voltage set value TEb is set based on the beam booster voltage information 93c, and consequently, the focus position of the focused ion beam matches the irradiation position of the electron beam.

The range of the beam booster voltage Vb that allows focusing is shown in FIG. 11, and thus description thereof is omitted here.

The operation of FIG. 14 can be applied to an operation of the composite charged particle beam apparatus according to the second embodiment.

The foregoing description of the first embodiment is given of the case in which the control unit 9c includes the storage unit 91c, but the present invention is not limited to this example. For example, the storage unit 91c may be provided outside the composite charged particle beam apparatus D. When the storage unit 91c is provided outside the composite charged particle beam apparatus D, for example, the storage unit 91c may be provided as an external storage device or a cloud server as well.

Further, instead of storing the scanning voltage information 92c and the beam booster voltage information 93c in the storage unit 91c, the storage unit 91c may store therein calculation expressions for deriving the beam booster voltage value Eb based on the acceleration voltage value Eacc. Still further, the storage unit 91c may store therein calculation expressions for deriving the first scanning voltage VdefU and the second scanning voltage VdefL based on the acceleration voltage value Eacc and the beam booster voltage value Eb. In this case, the control unit 9c may derive and set the beam booster voltage value Eb, the first scanning voltage VdefU, and the second scanning voltage VdefL based on those calculation expressions.

With the composite charged particle beam apparatus D according to the second embodiment, the beam booster voltage value Eb can be derived based on the acceleration voltage value Eacc, the focal length of a charged particle beam focused by the objective lens, and the focal length of an electron beam applied by an electron beam irradiation unit configured to apply the electron beam, and hence the charged particle beam can be focused onto the CP. That is, it is possible to set, in accordance with the acceleration voltage to be applied to the charged particle beam (ion beam B), a value (beam booster voltage value Eb) of the beam booster voltage Vb of the beam booster tube 4a that allows the focused ion beam to be focused onto the CP.

Third Embodiment

The above-mentioned charged particle beam apparatus according to Modification Example 1 of the first embodiment can be applied to a charged particle beam apparatus D1 according to a third embodiment of the present invention. That is, in the configuration of the charged particle beam apparatus described with reference to FIG. 3, the alignment electrode 41, the astigmatism correction electrode 42, and the blanking electrode 43 included in the beam booster 4b are not omitted. Further, the alignment power supply 61, the astigmatism correction power supply 62, and the blanking power supply 63 included in the beam booster control unit 6 are not omitted. The beam booster power supply unit 7 is not omitted.

Figure 18:
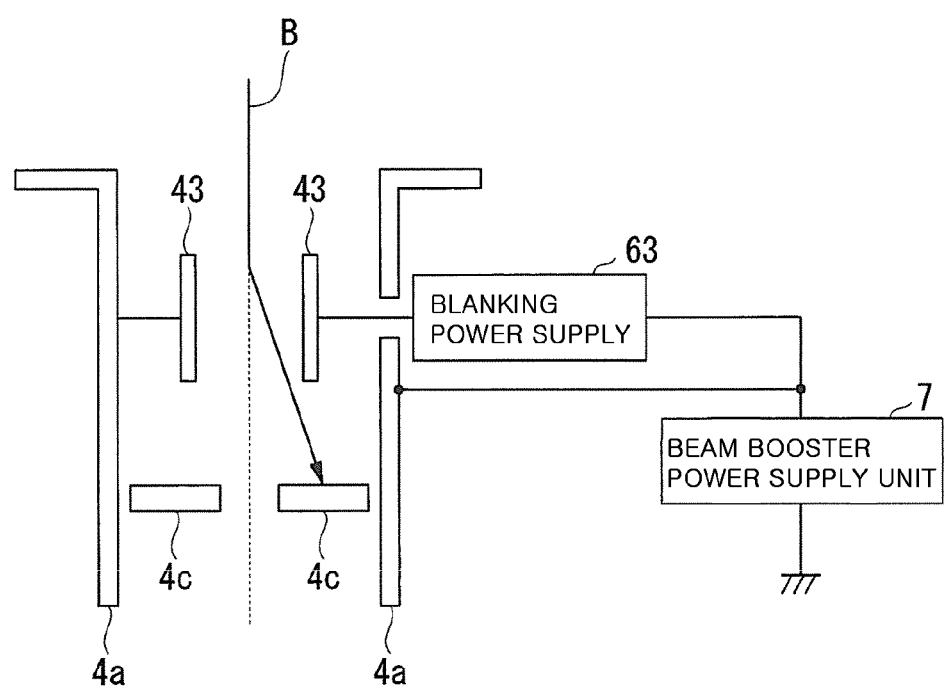
FIG. 18 is a partial view of a charged particle beam apparatus according to a third embodiment of the present invention.

FIG. 18 is a partial view for illustrating the charged particle beam apparatus according to the third embodiment. In FIG. 18, there are illustrated the beam booster tube 4a, the blanking electrode 43, the blanking power supply 63, and the beam booster power supply unit 7 in the configuration of the charged particle beam apparatus described with reference to FIG. 3. In FIG. 18, a blanking aperture 4c is also illustrated. To the blanking aperture 4c, the charged particle beam deflected by applying a blanking voltage Vblk to the blanking electrode 43 is guided.

The charged particle beam apparatus D1 according to the third embodiment is configured to derive a blanking voltage value Eblk being a value of the blanking voltage Vblk to be applied to the blanking electrode 43 based on a combination of the acceleration voltage value Eacc being a value of the acceleration voltage Vacc and the beam booster voltage value Eb being a value of the beam booster voltage Vb. The charged particle beam apparatus according to the third embodiment includes a control unit 9d in place of the control unit 9a.

The configuration of the control unit 9d is described in detail.

Figure 19:
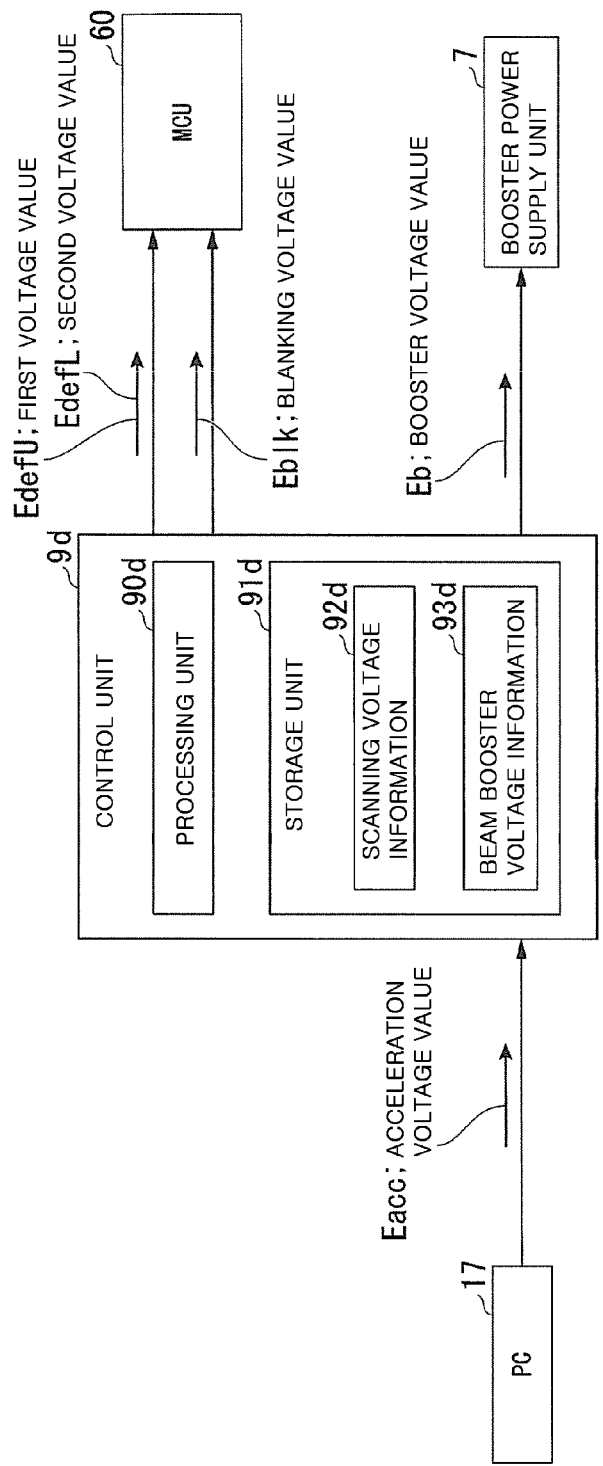
FIG. 19 is a diagram for illustrating a configuration example of a control unit in the charged particle beam apparatus according to the third embodiment.

FIG. 19 is a diagram for illustrating a configuration example of the control unit 9d in the charged particle beam apparatus according to the third embodiment. The control unit 9d includes a processing unit 90d and a storage unit 91d. In the storage unit 91d, scanning voltage information 92d and beam booster voltage information 93d are stored. The processing unit 90d is configured to derive the beam booster voltage value Eb being a value of the beam booster voltage Vb based on the acceleration voltage value Eacc supplied from the PC 17 and the beam booster voltage information 93d read out from the storage unit 91d. The processing unit 90d is configured to supply the calculated beam booster voltage value Eb to the beam booster power supply unit 7.

The processing unit 90d is configured to derive the first voltage value EdefU being a value of the first voltage VdefU and the second voltage value EdefL being a value of the second voltage VdefL based on the acceleration voltage value Eacc supplied from the PC 17 and the derived beam booster voltage value Eb. The processing unit 90d is configured to output the derived first voltage value EdefU and second voltage value EdefL to the MCU 60.

The processing unit 90d is configured to derive a value of the blanking voltage Vblk based on the acceleration voltage value Eacc supplied from the PC 17 and the derived value of the beam booster voltage Vb. For example, the processing unit 90d is configured to derive a value of the blanking voltage Vblk based on Expression (1). In Expression (1), k1 represents a proportionality constant.

$$Vblk = k1 \times (Vacc + Vb) \quad (1)$$

The processing unit 90d is configured to output, to the MCU 60, the blanking voltage value Eblk being the derived value of the blanking voltage Vblk.

The scanning voltage information 92a can be applied to the scanning voltage information 92d. The beam booster voltage information 93a can be applied to the beam booster voltage information 93d.

Next, description is given of processing of deriving the first voltage value EdefU, the second voltage value EdefL, and the blanking voltage value Eblk, and setting the derived first voltage value EdefU, second voltage value EdefL, and blanking voltage value Eblk in relation to an operation of the charged particle beam apparatus.

Figure 20:
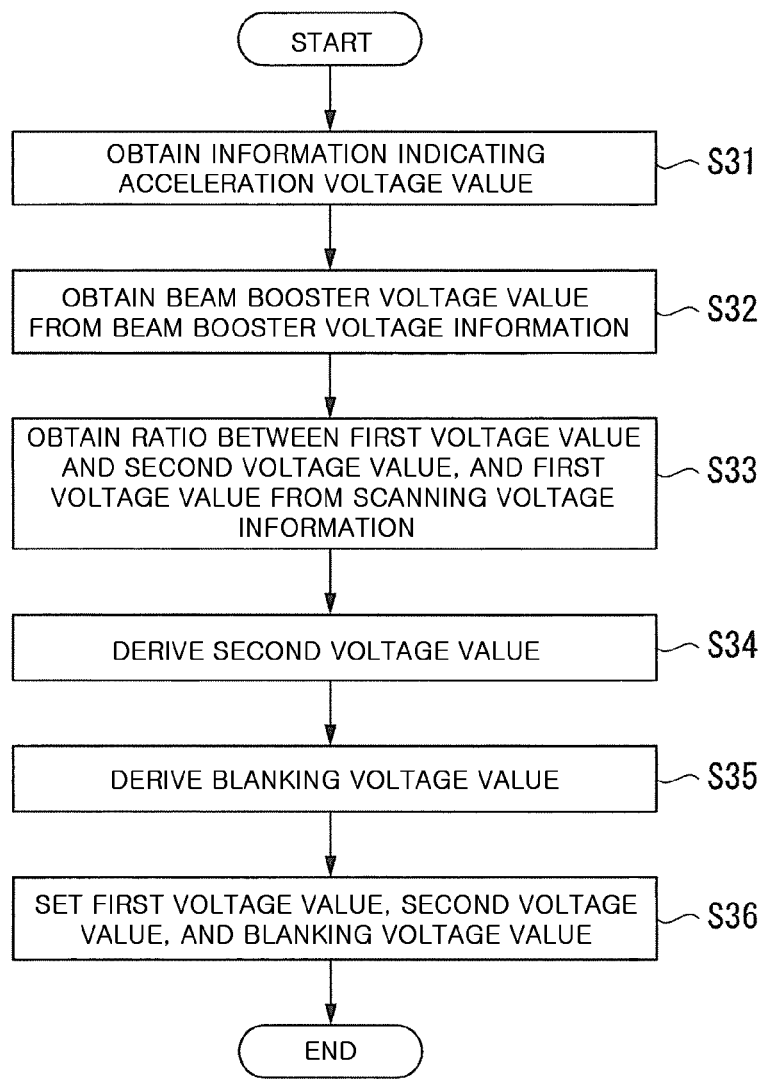
FIG. 20 is a flow chart for illustrating an operation example of the charged particle beam apparatus according to the third embodiment.

FIG. 20 is a flow chart for illustrating an operation example of the charged particle beam apparatus according to the third embodiment.

Step S11 to Step S14 described with reference to FIG. 14 can be applied to Step S31 to Step S34.

(Step S35)

In the charged particle beam apparatus D1, the processing unit 90d derives the blanking voltage value Eblk based on the obtained acceleration voltage value Eacc and beam booster voltage value Eb.

(Step S36)

In the charged particle beam apparatus D1, the processing unit 90d sets the first voltage value, the derived second voltage value, and the blanking voltage value in the MCU 60.

The description of the third embodiment is given of the case in which the processing unit 90d derives the value of the blanking voltage Vblk from Expression (1) based on the values of the acceleration voltage Vacc and the beam booster voltage Vb. However, the present invention is not limited to this example. For example, the storage unit 91d may store therein blanking voltage value information being information having a table format in which the acceleration voltage value Eacc, the beam booster voltage value Eb, and the blanking voltage value Eblk are associated with one another. In this case, the processing unit 90d obtains, from the blanking voltage value information, the blanking voltage value Eblk associated with a combination of the acceleration voltage value Eacc and the beam booster voltage value Eb, and then outputs the obtained blanking voltage value Eblk to the MCU 60.

The charged particle beam apparatus D1 according to the third embodiment includes: an ion source (in the third embodiment, ion emitter E) configured to generate ions; a first electrostatic lens (in the third embodiment, condenser lens) configured to accelerate and focus ions to form an ion beam; a beam booster electrode (in the third embodiment, beam booster power supply unit 7) configured to accelerate the ion beam to a higher level; one or a plurality of electrodes (in the third embodiment, alignment electrode 41, astigmatism correction electrode 42, and blanking electrode 43), which are placed in the beam booster electrode, and are configured to electrostatically deflect the ion beam; a second electrostatic lens (in the third embodiment, objective lens), which is placed between the one or plurality of electrodes and a sample table, and is configured to focus the ion beam applied with a voltage; and a processing unit configured to obtain a measurement condition, and set at least one of voltages to be applied to the one or plurality of electrodes or a voltage to be applied to each of the first electrostatic lens and the second electrostatic lens, based on the obtained measurement condition. In the charged particle beam apparatus D1, the blanking voltage Vblk being a voltage to be applied to the blanking electrode is derived based on a combination of the acceleration voltage value Eacc and the beam booster voltage value Eb, and the derived blanking voltage value Eblk is set. With this configuration, it is possible to perform voltage control that reflects an acceleration energy of the ion beam having entered the beam booster tube 4a and thus to perform control so as to obtain a desired beam trajectory.

Modification Example 1 of Third Embodiment

The above-mentioned charged particle beam apparatus according to the third embodiment can be applied to a charged particle beam apparatus D1 according to Modification Example 1 of the third embodiment.

Figure 21:
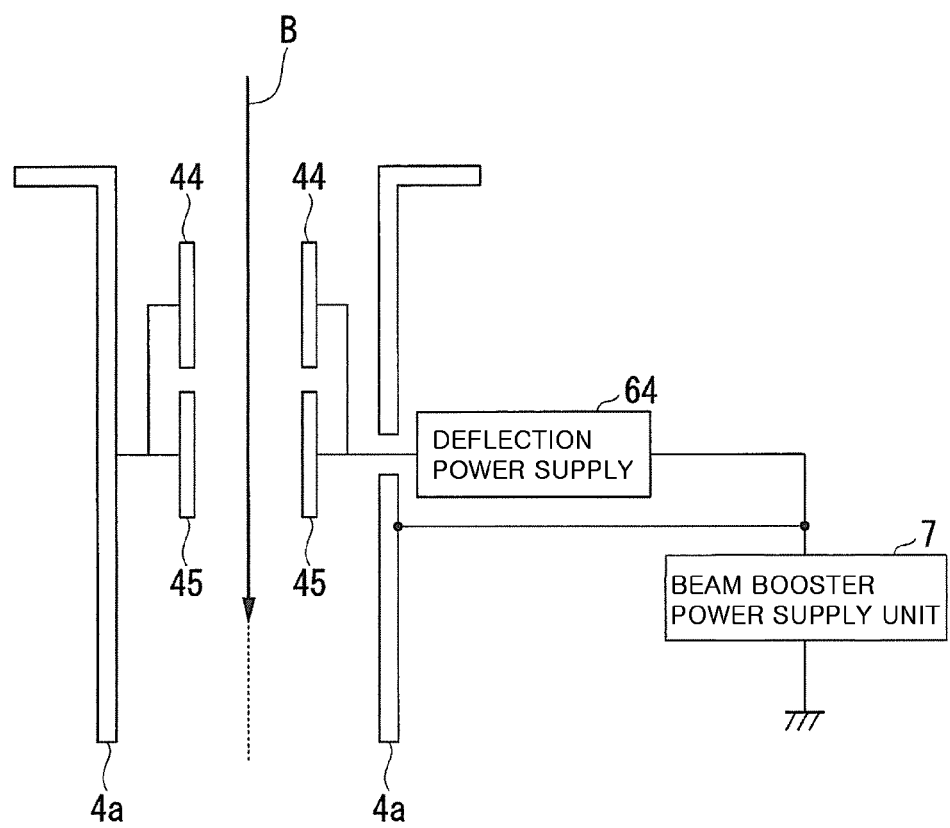
FIG. 21 is a partial view of a charged particle beam apparatus according to Modification Example 1 of the third embodiment.

FIG. 21 is a partial view for illustrating the charged particle beam apparatus according to Modification Example 1 of the third embodiment. In FIG. 21, there are illustrated the beam booster tube 4a, the first scanning electrode 44, the second scanning electrode 45, the deflection power supply 64, and the beam booster power supply unit 7 in the configuration of the charged particle beam apparatus described with reference to FIG. 3.

The charged particle beam apparatus D1 according to Modification Example 1 of the third embodiment is configured to change the first voltage value EdefU to be applied to the first scanning electrode 44 and the second voltage value EdefL to be applied to the second scanning electrode 45 based on a combination of the acceleration voltage value Eacc and the beam booster voltage value Eb. The charged particle beam apparatus according to Modification Example 1 of the third embodiment includes a control unit 9e in place of the control unit 9d.

The configuration of the control unit 9e is described in detail.

Figure 22:
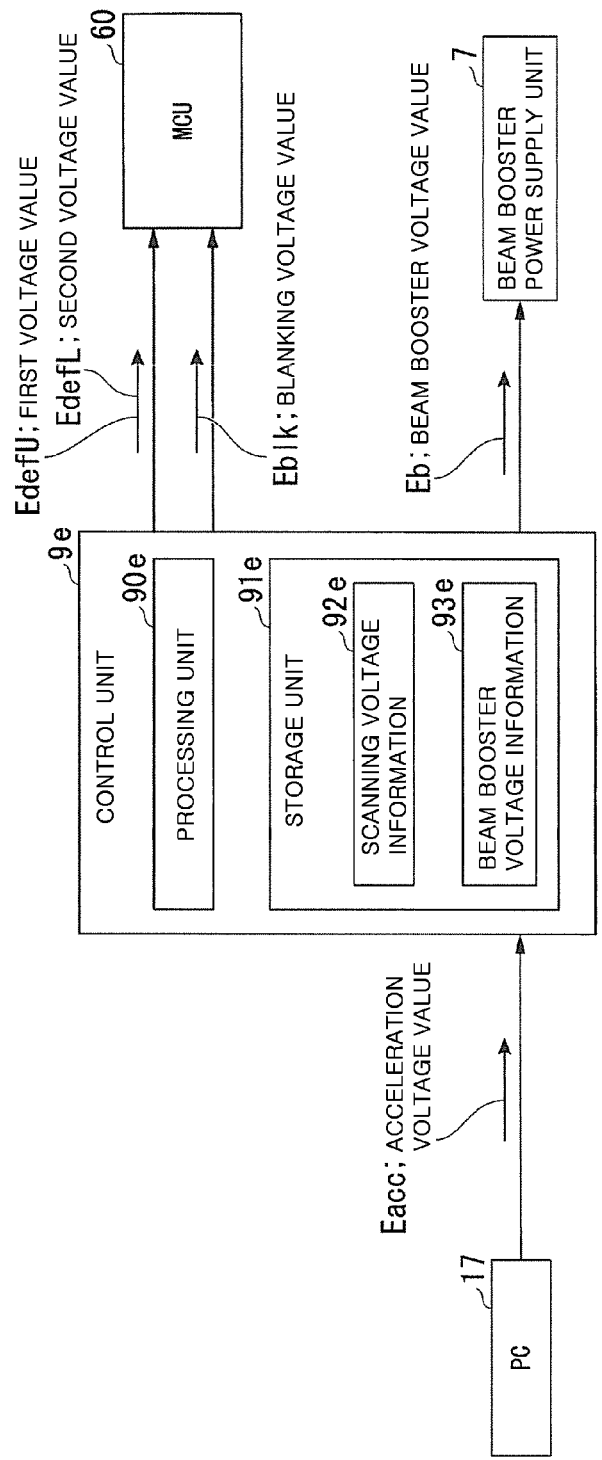
FIG. 22 is a diagram for illustrating a configuration example of a control unit in the charged particle beam apparatus according to Modification Example 1 of the third embodiment.

FIG. 22 is a diagram for illustrating a configuration example of the control unit in the charged particle beam apparatus according to Modification Example 1 of the third embodiment. The control unit 9e includes a processing unit 90e and a storage unit 91e. In the storage unit 91e, scanning voltage information 92e and beam booster voltage information 93e are stored.

The processing unit 90e is configured to derive the beam booster voltage value Eb being a value of the beam booster voltage Vb based on the acceleration voltage value Eacc supplied from the PC 17 and the beam booster voltage information 93e read out from the storage unit 91e. The processing unit 90e is configured to supply the calculated beam booster voltage value Eb to the beam booster power supply unit 7.

The processing unit 90e is configured to derive the first voltage value EdefU being a value of the first voltage VdefU and the second voltage value EdefL being a value of the second voltage VdefL based on the acceleration voltage value Eacc supplied from the PC 17 and the derived beam booster voltage value Eb. The processing unit 90e is configured to output the derived first voltage value EdefU and second voltage value EdefL to the MCU 60.

The processing unit 90e is configured to derive the first voltage value EdefU and the second voltage value EdefL based on the acceleration voltage value Eacc supplied from the PC 17 and the derived beam booster voltage value Eb. For example, the processing unit 90e is configured to derive values of the first voltage VdefU and the second voltage VdefL based on Expression (2) and Expression (3). In Expression (2), k2 represents a proportionality constant. In Expression (3), k3 represents a proportionality constant.

$$VdefU = k2 \times (Vacc + Vb) \qquad (2)$$

$$VdefL = k3 \times (Vacc + Vb) \qquad (3)$$

The processing unit 90e is configured to output the derived first voltage value EdefU and second voltage value EdefL to the MCU 60.

The scanning voltage information 92a can be applied to the scanning voltage information 92e. The beam booster voltage information 93a can be applied to the beam booster voltage information 93e.

Next, description is given of processing of deriving the first voltage value EdefU and the second voltage value EdefL, and setting the derived first voltage value EdefU and second voltage value EdefL in relation to an operation of the charged particle beam apparatus.

Figure 23:
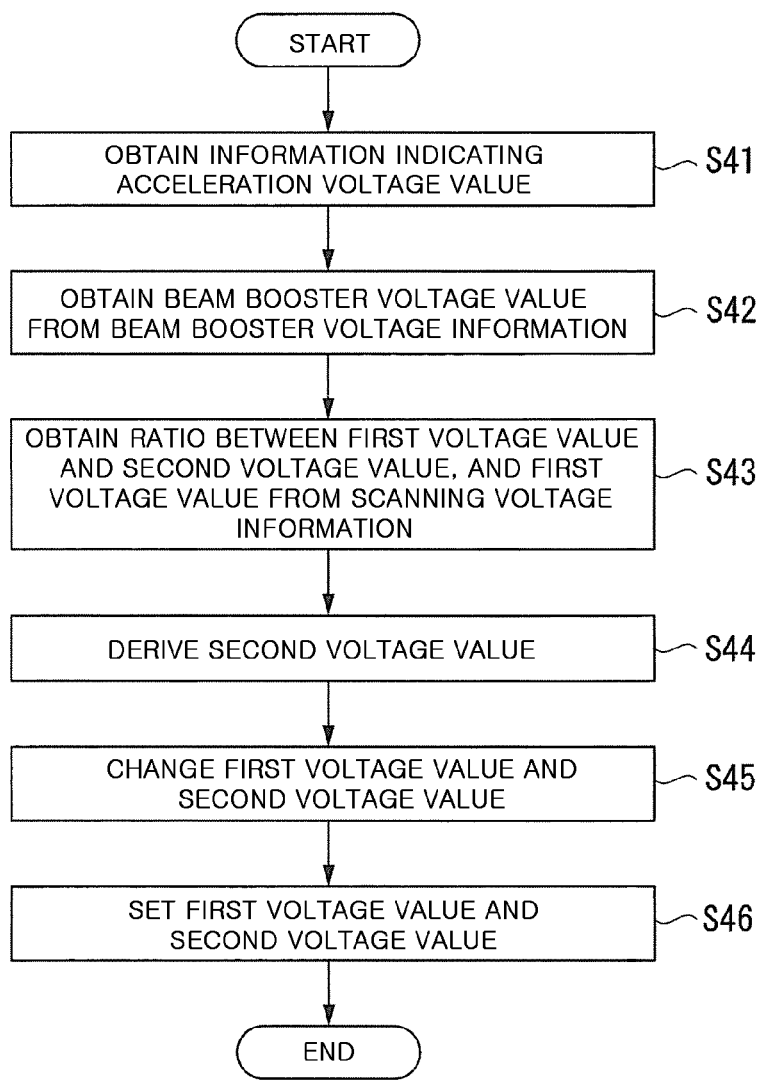
FIG. 23 is a flow chart for illustrating an operation example of the charged particle beam apparatus according to Modification Example 1 of the third embodiment.

FIG. 23 is a flow chart for illustrating an operation example of the charged particle beam apparatus according to Modification Example 1 of the third embodiment.

Step S11 to Step S14 described with reference to FIG. 14 can be applied to Step S41 to Step S44.

(Step S45)

In the charged particle beam apparatus D1, the processing unit 90e changes the first voltage value EdefU and the second voltage value EdefL based on the obtained acceleration voltage value Eacc and beam booster voltage value Eb.

(Step S46)

In the charged particle beam apparatus D1, the processing unit 90e sets the first voltage value EdefU and the derived second voltage value EdefL in the MCU 60.

The description of Modification Example 1 of the third embodiment is given of the case in which the processing unit 90e derives the first voltage value EdefU and the second voltage value EdefL from Expression (2) and Expression (3) based on the values of the acceleration voltage Vacc and the beam booster voltage Vb, but the present invention is not limited to this example. For example, the storage unit 91e may store therein scanning voltage value information being information having a table format in which the acceleration voltage value Eacc, the beam booster voltage value Eb, the first voltage value EdefU, and the second voltage value EdefL are associated with one another. In this case, the processing unit 90e obtains, from the scanning voltage value information, the first voltage value EdefU and the second voltage value EdefL associated with a combination of the acceleration voltage value Eacc and the beam booster voltage value Eb, and outputs the obtained first voltage value EdefU and second voltage value EdefL to the MCU 60.

The third embodiment and Modification Example 1 of the third embodiment may be combined together. That is, one of the first voltage value and the second voltage, and the blanking voltage value may be changed based on a combination of the acceleration voltage value Eacc and the beam booster voltage value Eb.

With the charged particle beam apparatus according to Modification Example 1 of the third embodiment, the first voltage value EdefU to be applied to the first scanning electrode 44 and the second voltage value EdefL to be applied to the second scanning electrode 45 are derived based on a combination of the acceleration voltage value Eacc and the beam booster voltage value Eb, to thereby set the derived first voltage value EdefU and second voltage value EdefL. With this configuration, it is possible to perform voltage control that reflects an acceleration energy of the ion beam having entered the beam booster tube 4a and thus to perform control so as to obtain a desired beam trajectory.

Modification Example 2 of Third Embodiment

The above-mentioned charged particle beam apparatus according to the third embodiment can be applied to a charged particle beam apparatus D1 according to Modification Example 2 of the third embodiment.

Figure 24:
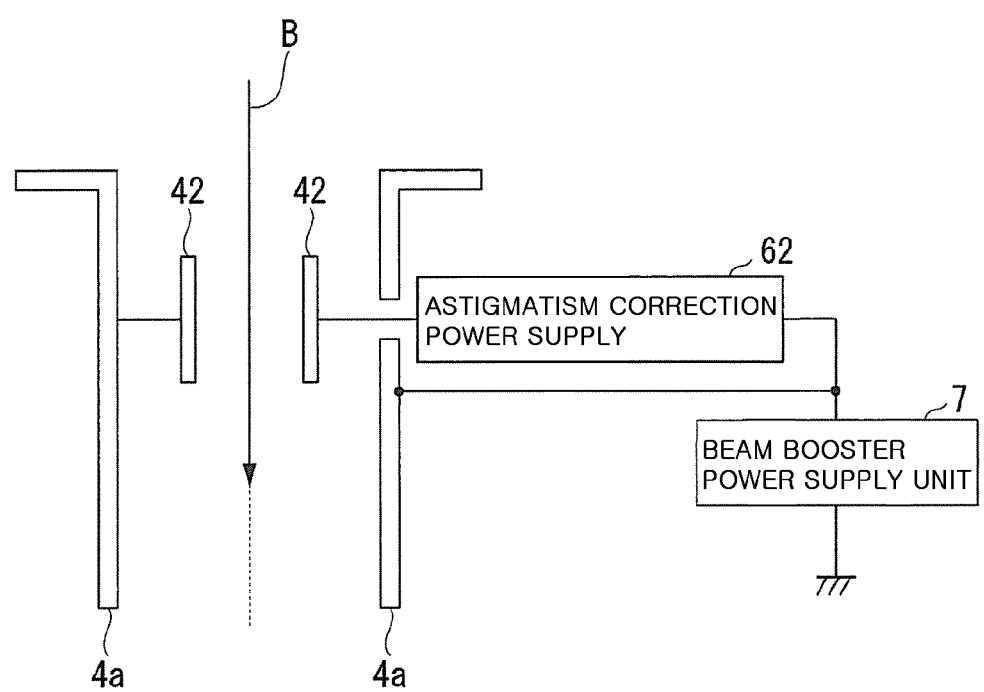
FIG. 24 is a partial view of a charged particle beam apparatus according to Modification Example 2 of the third embodiment.

FIG. 24 is a partial view for illustrating the charged particle beam apparatus according to Modification Example 2 of the third embodiment. In FIG. 24, there are illustrated the beam booster tube 4a, the astigmatism correction electrode 42, the astigmatism correction power supply 62, and the beam booster power supply unit 7 in the configuration of the charged particle beam apparatus described with reference to FIG. 3.

The charged particle beam apparatus D1 according to Modification Example 2 of the third embodiment is configured to derive an adjustment range ±Vstgaj of an astigmatism correction voltage to be applied to the astigmatism correction electrode 42 based on a combination of the acceleration voltage Vacc and the beam booster voltage Vb, to thereby set the derived adjustment range ±Estgaj of the astigmatism correction voltage. The charged particle beam apparatus according to Modification Example 2 of the third embodiment includes a control unit 9f in place of the control unit 9d.

The configuration of the control unit 9f is described in detail.

Figure 25:
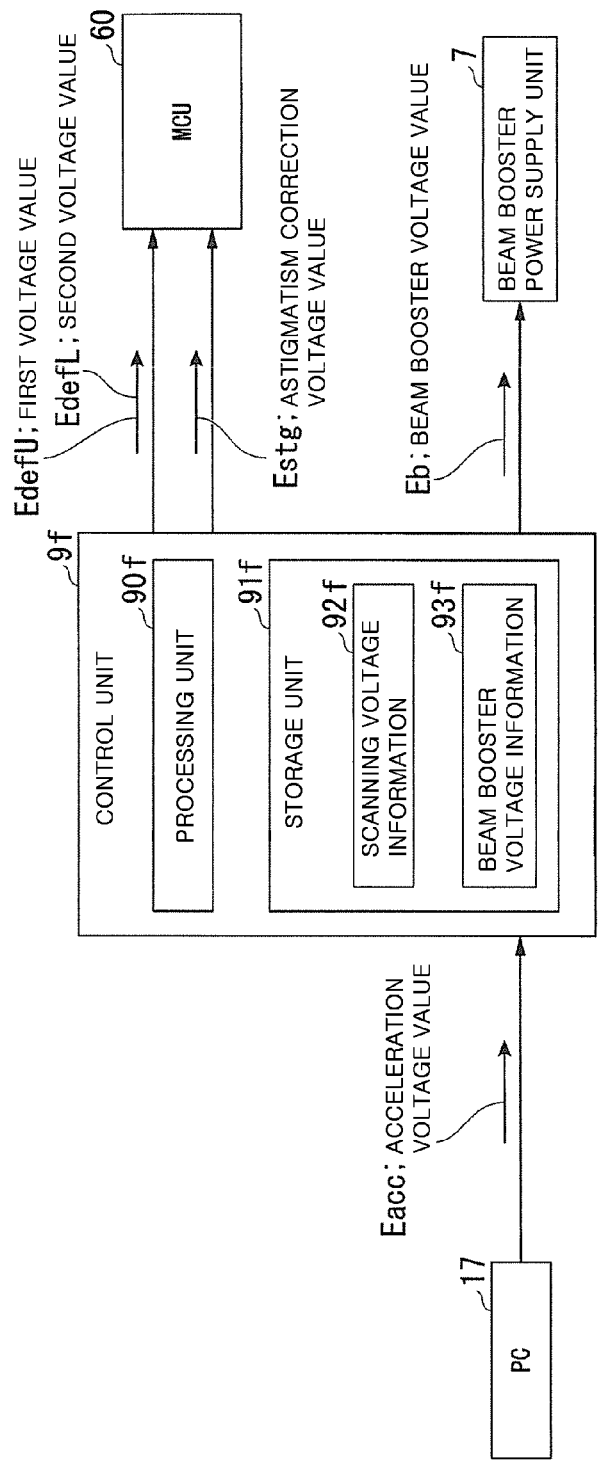
FIG. 25 is a diagram for illustrating a configuration example of a control unit in the charged particle beam apparatus according to Modification Example 2 of the third embodiment.

FIG. 25 is a diagram for illustrating a configuration example of the control unit 9f in the charged particle beam apparatus according to Modification Example 2 of the third embodiment. The control unit 9f includes a processing unit 90f and a storage unit 91f. In the storage unit 91f, scanning voltage information 92f and beam booster voltage information 93f are stored.

The processing unit 90f is configured to derive the beam booster voltage value Eb being a value of the beam booster voltage Vb based on the acceleration voltage value Eacc supplied from the PC 17 and the beam booster voltage information 93f read out from the storage unit 91f. The processing unit 90f is configured to supply the derived beam booster voltage value Eb to the beam booster power supply unit 7.

The processing unit 90f is configured to derive, based on the acceleration voltage value Eacc supplied from the PC 17 and the derived beam booster voltage value Eb, the first voltage value EdefU being a value of the first voltage VdefU and the second voltage value EdefL being a value of the second voltage VdefL. The processing unit 90d is configured to output the derived first voltage value EdefU and second voltage value EdefL to the MCU 60.

The processing unit 90f is configured to derive, based on the acceleration voltage value Eacc supplied from the PC 17 and the derived beam booster voltage value Eb, a value of the adjustment range ±Vstgaj of the astigmatism correction voltage. For example, the processing unit 90f is configured to derive a value of the adjustment range ±Vstgaj of the astigmatism correction voltage based on Expression (4). In Expression (4), k4 represents a proportionality constant.

$$Vstgaj = k4 \times (Vacc + Vb) \qquad (4)$$

The processing unit 90f is configured to output the derived adjustment range ±Estgaj of the astigmatism correction voltage to the MCU 60.

The scanning voltage information 92a can be applied to the scanning voltage information 92f. The beam booster voltage information 93a can be applied to the beam booster voltage information 93f.

Next, description is given of processing of deriving the first voltage value EdefU, the second voltage value EdefL, and the adjustment range ±Estgaj of the astigmatism correction voltage, and setting the derived first voltage value EdefU, second voltage value EdefL, and adjustment range ±Estgaj of the astigmatism correction voltage in relation to an operation of the charged particle beam apparatus.

Figure 26:
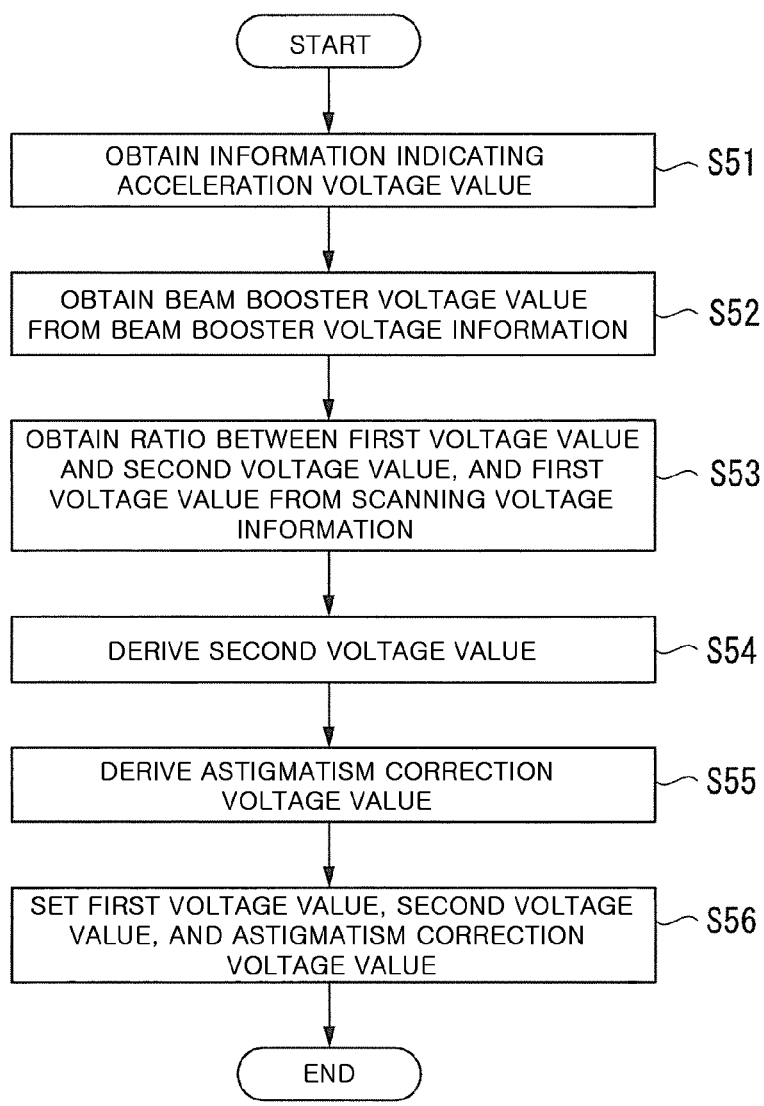
FIG. 26 is a flow chart for illustrating an operation example of the charged particle beam apparatus according to Modification Example 2 of the third embodiment.

FIG. 26 is a flow chart for illustrating an operation example of the charged particle beam apparatus according to Modification Example 2 of the third embodiment.

Step S11 to Step S14 described with reference to FIG. 14 can be applied to Step S51 to Step S54.

(Step S55)

In the charged particle beam apparatus D1, the processing unit 90f derives the adjustment range ±Estgaj of the astigmatism correction voltage based on the obtained acceleration voltage value Eacc and beam booster voltage value Eb.

(Step S56)

In the charged particle beam apparatus D1, the processing unit 90f sets the first voltage value, the derived second voltage value, and the astigmatism correction voltage value in the MCU 60.

The description of Modification Example 2 of the third embodiment is given of the case in which the processing unit 90f derives, based on the values of the acceleration voltage Vacc and the beam booster voltage Vb, the value of the adjustment range ±Vstgaj of the astigmatism correction voltage from Expression (4), but the present invention is not limited to this example. For example, the storage unit 91f may store therein astigmatism correction voltage value information being information having a table format in which the acceleration voltage value Eacc, the beam booster voltage value Eb, and the value of the adjustment range ±Estgaj of the astigmatism correction voltage are associated with one another. In this case, the processing unit 90f obtains, from the astigmatism correction voltage value information, the adjustment range ±Estgaj of the astigmatism correction voltage associated with a combination of the acceleration voltage value Eacc and the beam booster voltage value Eb, and then outputs the obtained adjustment range ±Estgaj of the astigmatism correction voltage to the MCU 60.

The third embodiment, Modification Example 1 of the third embodiment, and Modification Example 2 of the third embodiment may be combined together. Alternatively, Modification Example 1 of the third embodiment and Modification Example 2 of the third embodiment may be combined together. That is, at least one of the first voltage value and the second voltage value, the blanking voltage value, or the adjustment range of the astigmatism correction voltage may be changed based on a combination of the acceleration voltage value Eacc and the beam booster voltage value Eb.

With the charged particle beam apparatus according to Modification Example 2 of the third embodiment, the adjustment range ±Estgaj of the astigmatism correction voltage being a voltage to be applied to the astigmatism correction electrode is derived based on a combination of the acceleration voltage and the beam booster voltage, to thereby set the derived adjustment range ±Estgaj of the astigmatism correction voltage. With this configuration, it is possible to perform astigmatism correction within the adjustment range of the astigmatism correction voltage, which reflects an acceleration energy of the ion beam having entered the beam booster tube, and thus to perform adjustment efficiently with proper adjustment sensitivity.

Further, it is also possible to store the adjusted value (Estg), and set the stored astigmatism correction voltage value Estg as an astigmatism correction electrode application voltage next time the same acceleration voltage and the same beam booster voltage are set.

Modification Example 3 of Third Embodiment

The above-mentioned charged particle beam apparatus according to the third embodiment can be applied to a charged particle beam apparatus D1 according to Modification Example 3 of the third embodiment.

Figure 27:
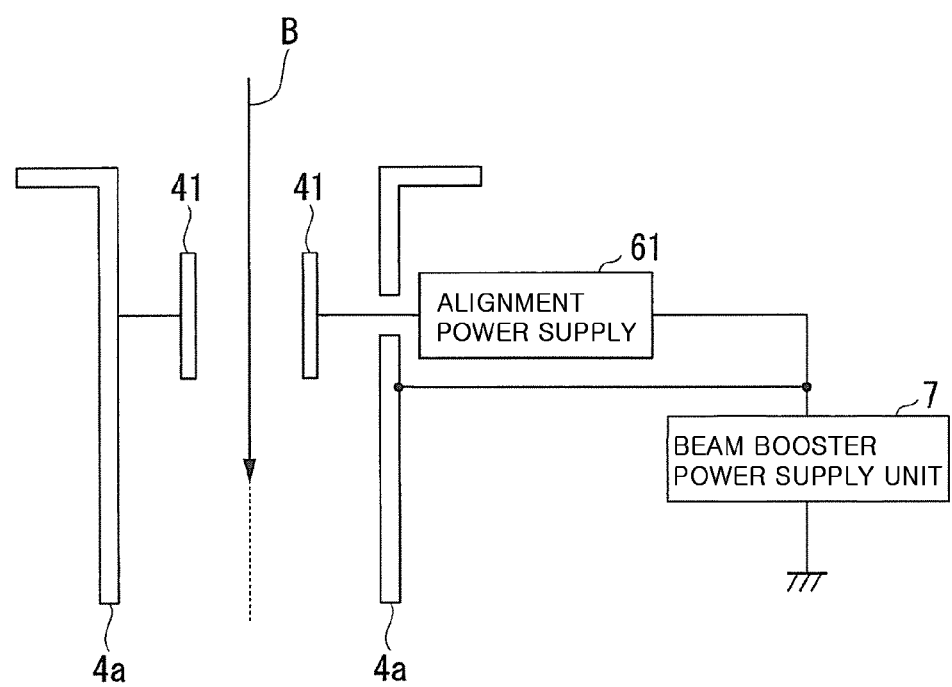
FIG. 27 is a partial view of a charged particle beam apparatus according to Modification Example 3 of the third embodiment.

FIG. 27 is a partial view for illustrating the charged particle beam apparatus according to Modification Example 3 of the third embodiment. In FIG. 27, there are illustrated the beam booster tube 4a, the alignment electrode 41, the alignment power supply 61, and the beam booster power supply unit 7 in the configuration of the charged particle beam apparatus described with reference to FIG. 3.

The charged particle beam apparatus D1 according to Modification Example 3 of the third embodiment is configured to change an adjustment range±Valgaj of an alignment voltage to be applied to the alignment electrode 41 based on a combination of the acceleration voltage Vacc and the beam booster voltage Vb. The charged particle beam apparatus according to Modification Example 3 of the third embodiment includes a control unit 9g in place of the control unit 9d.

The configuration of the control unit 9g is described in detail.

Figure 28:
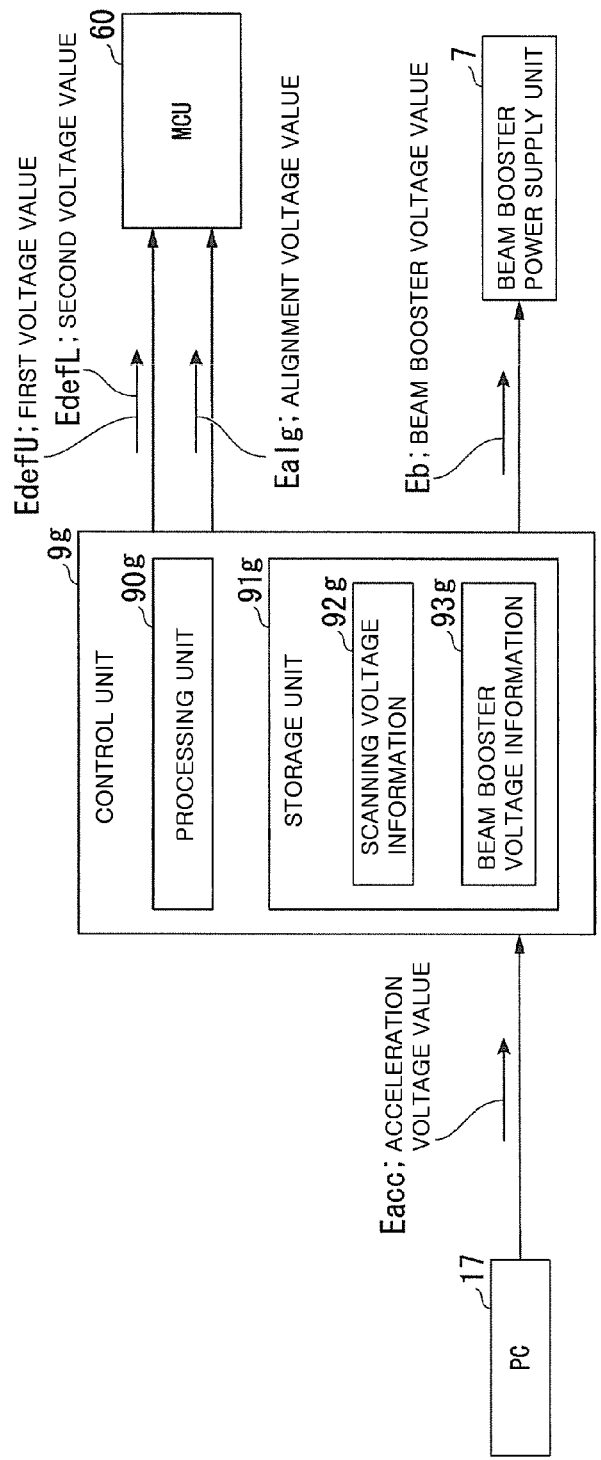
FIG. 28 is a diagram for illustrating a configuration example of a control unit in the charged particle beam apparatus according to Modification Example 3 of the third embodiment.

FIG. 28 is a diagram for illustrating a configuration example of the control unit 9g in the charged particle beam apparatus according to Modification Example 3 of the third embodiment. The control unit 9g includes a processing unit 90g and a storage unit 91g. In the storage unit 91g, scanning voltage information 92g and beam booster voltage information 93g are stored.

The processing unit 90g is configured to derive, based on the acceleration voltage value Eacc supplied from the PC 17 and the beam booster voltage information 93g read out from the storage unit 91g, the beam booster voltage value Eb being a value of the beam booster voltage Vb. The processing unit 90g is configured to supply the derived beam booster voltage value Eb to the beam booster power supply unit 7.

The processing unit 90g is configured to derive, based on the acceleration voltage value Eacc supplied from the PC 17 and the derived beam booster voltage value Eb, the first voltage value EdefU being a value of the first voltage VdefU and the second voltage value EdefL being a value of the second voltage VdefL. The processing unit 90g is configured to output the derived first voltage value EdefU and second voltage value EdefL to the MCU 60.

The processing unit 90g is configured to derive, based on the acceleration voltage value Eacc supplied from the PC 17 and the derived beam booster voltage value Eb, a value of the adjustment range±Valgaj of the alignment voltage. For example, the processing unit 90g is configured to derive a value of the adjustment range±Valgaj of the alignment voltage based on Expression (5). In Expression (5), k5 represents a proportionality constant.

$$Valgaj = k5 \times (Vacc + Vb) \quad (5)$$

The processing unit 90g is configured to output the derived adjustment range ±Ealgaj of the alignment voltage to the MCU 60.

The scanning voltage information 92a can be applied to the scanning voltage information 92g. The beam booster voltage information 93a can be applied to the beam booster voltage information 93g.

Next, description is given of processing of setting the first voltage value EdefU, the second voltage value EdefL, and the adjustment range ±Ealgaj of the alignment voltage in relation to an operation of the charged particle beam apparatus.

Figure 29:
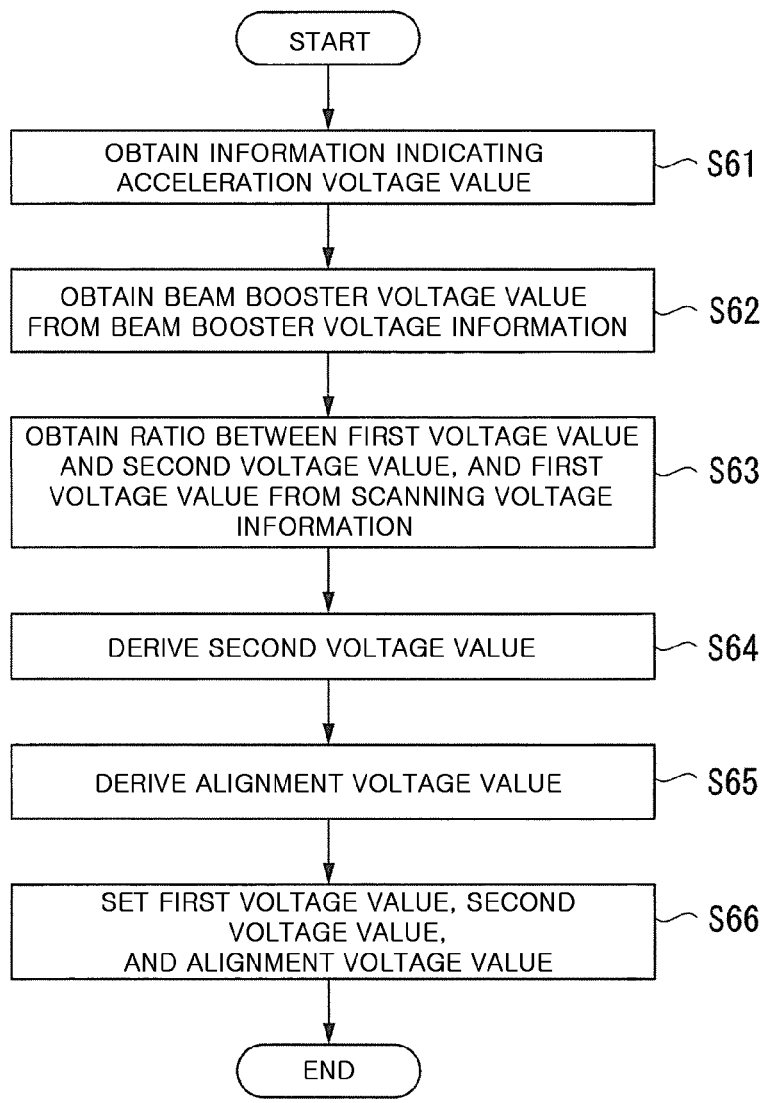
FIG. 29 is a flow chart for illustrating an operation example of the charged particle beam apparatus according to Modification Example 3 of the third embodiment.

FIG. 29 is a flow chart for illustrating an operation example of the charged particle beam apparatus according to Modification Example 3 of the third embodiment.

Step S11 to Step S14 described with reference to FIG. 14 can be applied to Step S61 to Step S64.

(Step S65)

In the charged particle beam apparatus D1, the processing unit 90g derives the adjustment range ±Ealgaj of the alignment voltage based on the obtained acceleration voltage value Eacc and beam booster voltage value Eb.

(Step S66)

In the charged particle beam apparatus D1, the processing unit 90g sets the first voltage value, the derived second voltage value, and the adjustment range ±Ealgaj of the alignment voltage in the MCU 60.

The description of Modification Example 3 of the third embodiment is given of the case in which the processing unit 90g derives, based on the values of the acceleration voltage Vacc and the beam booster voltage Vb, the value of the adjustment range ±Ealgaj of the alignment voltage from Expression (5), but the present invention is not limited to this example. For example, the storage unit 91g may store therein alignment voltage value information being information having a table format in which the acceleration voltage value Eacc, the beam booster voltage value Eb, and the adjustment range ±Ealgaj of the alignment voltage are associated with one another. In this case, the processing unit 90g obtains, from the alignment voltage value information, the adjustment range ±Ealgaj of the alignment voltage associated with a combination of the acceleration voltage value Eacc and the beam booster voltage value Eb, and then outputs the obtained adjustment range ±Ealgaj of the alignment voltage to the MCU 60.

The third embodiment, Modification Example 1 of the third embodiment, Modification Example 2 of the third embodiment, and Modification Example 3 of the third embodiment may be combined together. The third embodiment and Modification Example 3 of the third embodiment may be combined together. Modification Example 1 of the third embodiment and Modification Example 3 of the third embodiment may be combined together. Modification Example 2 of the third embodiment and Modification Example 3 of the third embodiment may be combined together. That is, at least one of the first voltage value and the second voltage value, the blanking voltage value, the adjustment range of the astigmatism correction voltage, or the adjustment range of the alignment voltage may be changed based on a combination of the acceleration voltage value Eacc and the beam booster voltage value Eb.

With the charged particle beam apparatus according to Modification Example 3 of the third embodiment, the adjustment range ±Ealgaj of the alignment voltage being a range of the voltage to be applied to the alignment electrode is derived based on a combination of the acceleration voltage and the beam booster voltage, to thereby set the derived adjustment range ±Ealgaj of the alignment voltage. With this configuration, it is possible to perform voltage control that reflects an acceleration energy of the ion beam having entered the beam booster tube, and thus to perform alignment adjustment within the adjustment range of the alignment voltage. It is therefore possible to perform adjustment efficiently with proper adjustment sensitivity.

Further, it is also possible to store the adjusted value (Ealg), and set the stored alignment voltage value Ealg as an alignment electrode application voltage next time the same acceleration voltage and the same beam booster voltage are set.

Modification Example 4 of Third Embodiment

The above-mentioned charged particle beam apparatus according to the third embodiment can be applied to a charged particle beam apparatus D1 according to Modification Example 4 of the third embodiment.

The charged particle beam apparatus D1 according to Modification Example 4 of the third embodiment is configured to change the condenser lens voltage Vcl being a voltage to be applied to the condenser lens center electrode 3, based on a combination of the acceleration voltage Vacc and the beam booster voltage Vb. The charged particle beam apparatus according to Modification Example 4 of the third embodiment includes a control unit 9h in place of the control unit 9d.

The configuration of the control unit 9h is described in detail.

Figure 30:
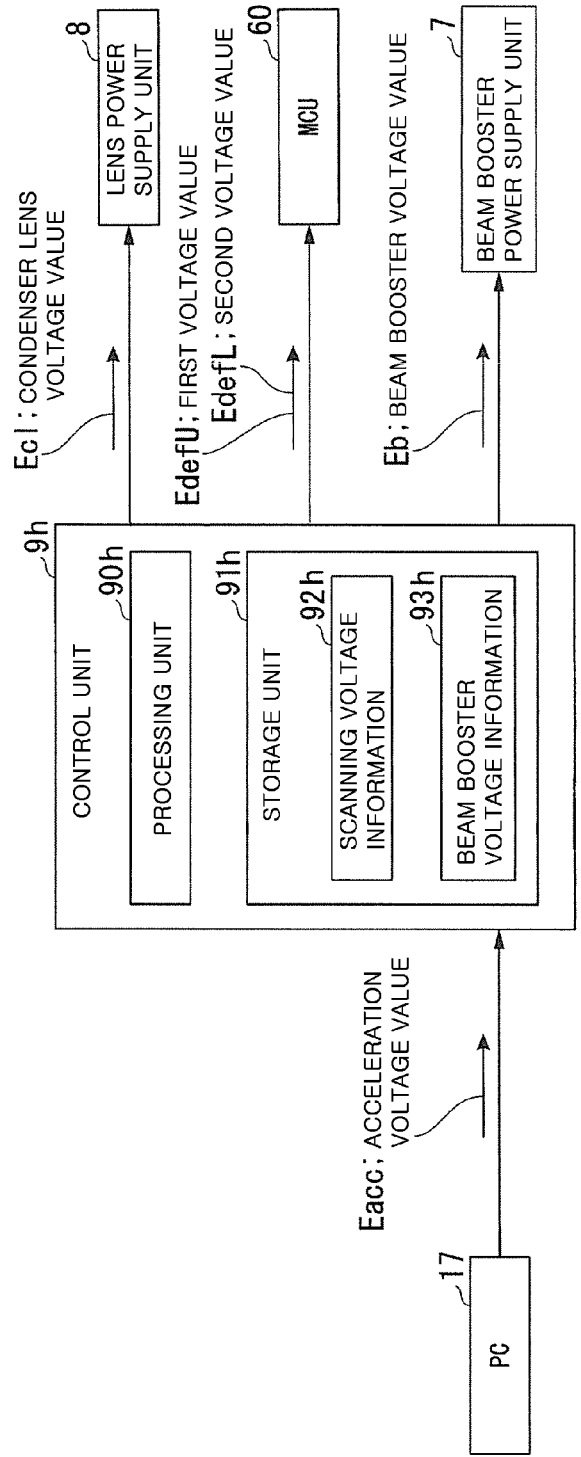
FIG. 30 is a diagram for illustrating a configuration example of a control unit in a charged particle beam apparatus according to Modification Example 4 of the third embodiment.

FIG. 30 is a diagram for illustrating a configuration example of the control unit 9h in the charged particle beam apparatus according to Modification Example 4 of the third embodiment. The control unit 9h includes a processing unit 90h and a storage unit 91h. In the storage unit 91h, scanning voltage information 92h and beam booster voltage information 93h are stored.

The processing unit 90h is configured to derive, based on the acceleration voltage value Eacc supplied from the PC 17 and the beam booster voltage information 93h read out from the storage unit 91h, the beam booster voltage value Eb being a value of the beam booster voltage Vb. The processing unit 90h is configured to supply the derived beam booster voltage value Eb to the beam booster power supply unit 7.

The processing unit 90h is configured to derive, based on the acceleration voltage value Eacc supplied from the PC 17 and the derived beam booster voltage value Eb, the first voltage value EdefU being a value of the first voltage VdefU and the second voltage value EdefL being a value of the second voltage VdefL. The processing unit 90h is configured to output the derived first voltage value EdefU and second voltage value EdefL to the MCU 60.

The processing unit 90h is configured to derive, based on the value of the acceleration voltage Vacc supplied from the PC 17 and the derived value of the beam booster voltage Vb, a value of the condenser lens voltage Vcl. For example, the processing unit 90h is configured to derive a value of the condenser lens voltage Vcl (kV) based on Expression (6). In Expression (6), n1, n2, n3, and n4 each represent a proportionality constant.

$$Vcl = n1 \times Vacc + n2 \times Vacc \times Vb + n3 \times Vb - n4 \quad (6)$$

The processing unit 90h is configured to output the derived condenser lens voltage value (Ecl) to the lens power supply unit 8.

The scanning voltage information 92a can be applied to the scanning voltage information 92h. The beam booster voltage information 93a can be applied to the beam booster voltage information 93h.

Next, description is given of processing of deriving the first voltage value EdefU, the second voltage value EdefL, and the condenser lens voltage value Ecl, and then setting the derived first voltage value EdefU, second voltage value EdefL, and condenser lens voltage value Ecl in relation to an operation of the charged particle beam apparatus.

Figure 31:
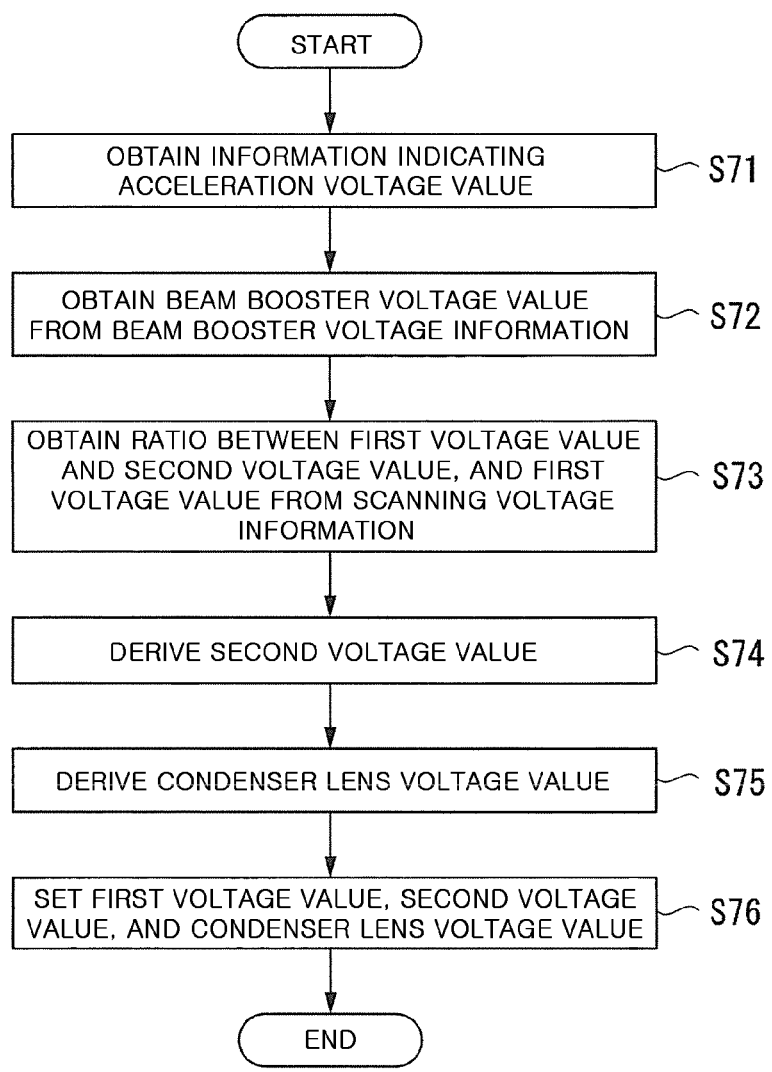
FIG. 31 is a flow chart for illustrating an operation example of the charged particle beam apparatus according to Modification Example 4 of the third embodiment.

FIG. 31 is a flow chart for illustrating an operation example of the charged particle beam apparatus according to Modification Example 4 of the third embodiment.

Step S11 to Step S14 described with reference to FIG. 14 can be applied to Step S71 to Step S74.

(Step S75)

In the charged particle beam apparatus D1, the processing unit 90h derives the condenser lens voltage value Ecl based on the obtained acceleration voltage value Eacc and beam booster voltage value Eb.

(Step S76)

In the charged particle beam apparatus D1, the processing unit 90h sets the first voltage value and the derived second voltage value in the MCU 60. The processing unit 90h sets the derived condenser lens voltage value in the lens power supply unit 8.

The description of Modification Example 4 of the third embodiment is given of the case in which the processing unit 90h derives the value of the condenser lens voltage Vcl from Expression (6) based on the values of the acceleration voltage Vacc and the beam booster voltage Vb, but the present invention is not limited to this example. For example, the storage unit 91h may store therein condenser lens voltage information being information having a table format in which the value of the acceleration voltage Vacc, the value of the beam booster voltage Vb, and the value of the condenser lens voltage Vcl are associated with one another.

FIG. 32 is a diagram for illustrating an example of the condenser lens voltage information. FIG. 32 shows, as an example of the condenser lens voltage information, condenser lens voltage values for respective combinations of the acceleration voltages Vacc of 5 kV, 3 kV, 2 kV, and 1 kV and the beam booster voltages Vb of −2 kV, −3 kV, −4 kV, and −5 kV. The acceleration voltage Vacc and the beam booster voltage Vb shown in FIG. 32 are given as an example, and the present invention is not limited to this example.

The processing unit 90h is configured to obtain, from the condenser lens voltage information, the condenser lens voltage associated with a combination of the values of the acceleration voltage Vacc and the beam booster voltage Vb. With this configuration, the processing unit 90h can derive the condenser lens voltage value without any calculation, and thus a processing load on the processing unit 90h can be reduced.

At least two of the third embodiment, and Modification Examples 1 to 4 of the third embodiment may be combined together. That is, at least one of the first voltage value and the second voltage value, the blanking voltage value, the adjustment range of the astigmatism correction voltage, the adjustment range of the alignment voltage, or the condenser lens voltage value may be changed based on a combination of the acceleration voltage value Eacc and the beam booster voltage value Eb.

With the charged particle beam apparatus according to Modification Example 4 of the third embodiment, the condenser lens voltage value Ecl being a voltage to be applied to the condenser lens is derived based on a combination of the acceleration voltage and the beam booster voltage, to thereby set the derived condenser lens voltage value Ecl.

With this configuration, it is possible to perform voltage control that reflects an acceleration energy of the ion beam having entered the beam booster tube, and thus to perform control so as to obtain a desired beam trajectory.

Modification Example 5 of Third Embodiment

The above-mentioned charged particle beam apparatus according to the third embodiment can be applied to a charged particle beam apparatus D1 according to Modification Example 5 of the third embodiment.

The charged particle beam apparatus D1 according to Modification Example 5 of the third embodiment is configured to change the objective lens voltage Vol being a voltage to be applied to the objective lens center electrode 5 based on a combination of the acceleration voltage Vacc and the beam booster voltage Vb. The charged particle beam apparatus according to Modification Example 5 of the third embodiment includes a control unit 9i in place of the control unit 9d.

The configuration of the control unit 9i is described in detail.

Figure 33:
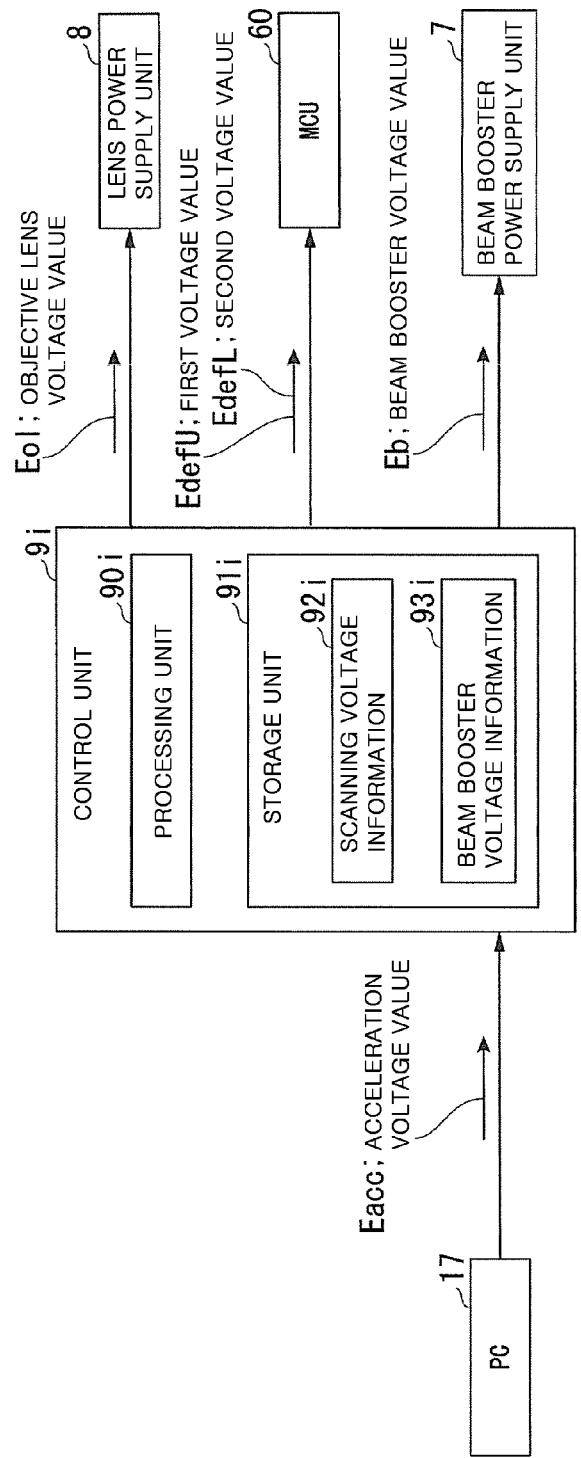
FIG. 33 is a diagram for illustrating a configuration example of a control unit in a charged particle beam apparatus according to Modification Example 5 of the third embodiment.

FIG. 33 is a diagram for illustrating a configuration example of the control unit 9i in the charged particle beam apparatus according to Modification Example 5 of the third embodiment. The control unit 9i includes a processing unit 90i and a storage unit 91i. In the storage unit 91i, scanning voltage information 92i and beam booster voltage information 93i are stored.

The processing unit 90i is configured to derive the beam booster voltage value Eb being a value of the beam booster voltage Vb based on the acceleration voltage value Eacc supplied from the PC 17 and the beam booster voltage information 93i read out from the storage unit 91i. The processing unit 90i is configured to supply the derived beam booster voltage value Eb to the beam booster power supply unit 7.

The processing unit 90i is configured to derive, based on the acceleration voltage value Eacc supplied from the PC 17 and the derived beam booster voltage value Eb, the first voltage value EdefU being a value of the first voltage VdefU and the second voltage value EdefL being a value of the second voltage VdefL. The processing unit 90i is configured to output the derived first voltage value EdefU and second voltage value EdefL to the MCU 60.

The processing unit 90i is configured to derive, based on the acceleration voltage value Eacc supplied from the PC 17 and the derived beam booster voltage value Eb, an objective lens voltage value Eol being a value of the objective lens voltage Vol. For example, the processing unit 90i is configured to derive a value of the objective lens voltage Vol (kV) based on Expression (7). In Expression (7), m1, m2, m3, and m4 each represent a constant.

$$Vol = m1 \times Vacc + m2 \times Vacc \times Vb - m3 \times Vb - m4 \qquad (7)$$

The processing unit 90i is configured to output the derived condenser lens voltage value Eol to the lens power supply unit 8.

The scanning voltage information 92a can be applied to the scanning voltage information 92i. The beam booster voltage information 93a can be applied to the beam booster voltage information 93i.

Next, description is given of processing of deriving the first voltage value EdefU, the second voltage value EdefL, and the objective lens voltage value Eol, and setting the derived first voltage value EdefU, second voltage value EdefL, and objective lens voltage value Eol in relation to an operation of the charged particle beam apparatus.

Figure 34:
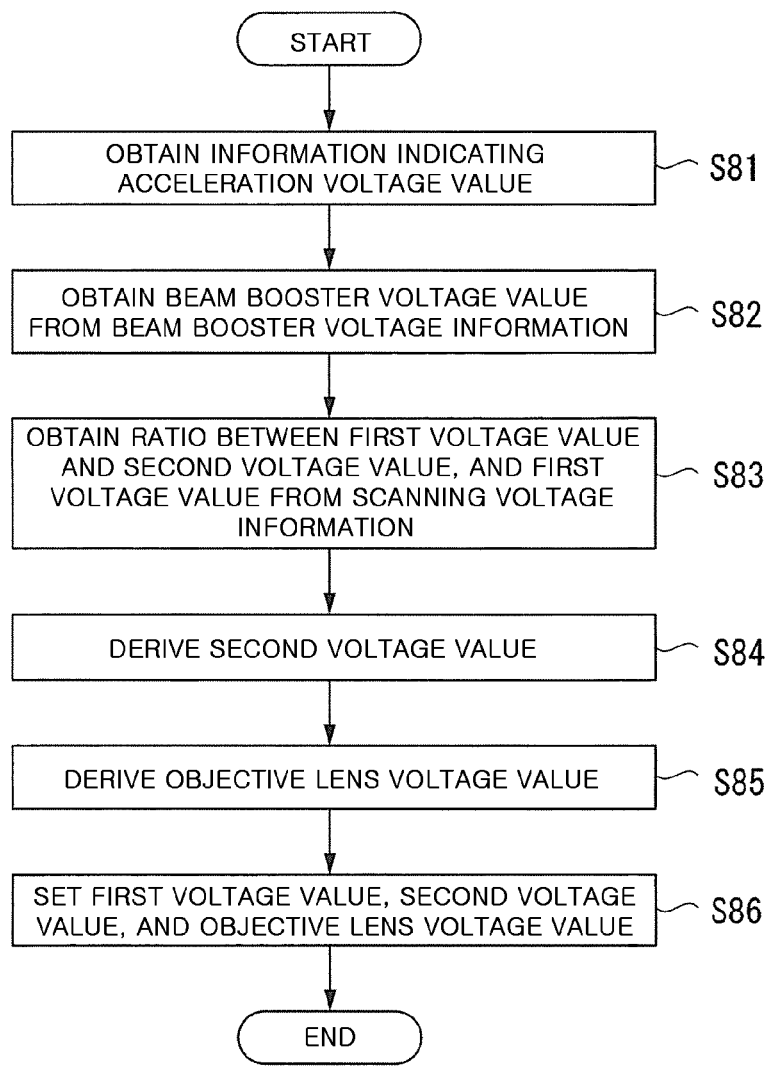
FIG. 34 is a flow chart for illustrating an operation example of the charged particle beam apparatus according to Modification Example 5 of the third embodiment.

FIG. 34 is a flow chart for illustrating an operation example of the charged particle beam apparatus according to Modification Example 5 of the third embodiment.

Step S11 to Step S14 described with reference to FIG. 14 can be applied to Step S81 to Step S84.

(Step S85)

In the charged particle beam apparatus D1, the processing unit 90i derives the objective lens voltage value Eol based on the obtained acceleration voltage value Eacc and beam booster voltage value Eb.

(Step S86)

In the charged particle beam apparatus D1, the processing unit 90i sets the first voltage value and the derived second voltage value in the MCU 60. The processing unit 90i sets the derived objective lens voltage value in the lens power supply unit 8.

The description of Modification Example 5 of the third embodiment is given of the case in which the processing unit 90i derives, based on the values of the acceleration voltage Vacc and the beam booster voltage Vb, the value of the objective lens voltage Vol from Expression (7), but the present invention is not limited to this example. For example, the storage unit 91i may store therein objective lens voltage information being information having a table format in which the acceleration voltage Vacc, the beam booster voltage Vb, and the objective lens voltage are associated with one another.

FIG. 35 is a diagram for illustrating an example of the objective lens voltage information. FIG. 35 shows, as an example of the objective lens voltage information, objective lens voltage values for respective combinations of the acceleration voltages Vacc of 5 kV, 3 kV, 2 kV, and 1 kV and the beam booster voltages Vb of −2 kV, −3 kV, −4 kV, and −5 kV. The acceleration voltage Vacc and the beam booster voltage Vb shown in FIG. 35 are given as an example, and the present invention is not limited to this example.

The processing unit 90i is configured to obtain, from the objective lens voltage information, the objective lens voltage associated with a combination of the values of the acceleration voltage Vacc and the beam booster voltage Vb. With this configuration, the processing unit 90i can derive the objective lens voltage value without any calculation, and thus a processing load on the processing unit 90i can be reduced.

At least two of the third embodiment and Modification Examples 1 to 5 of the third embodiment may be combined together. That is, at least one of the first voltage value and the second voltage value, the blanking voltage value, the adjustment range of the astigmatism correction voltage, the adjustment range of the alignment voltage, the condenser lens voltage value, or the objective lens voltage value may be changed based on a combination of the acceleration value Eacc and the beam booster voltage value Eb.

With the charged particle beam apparatus according to Modification Example 5 of the third embodiment, the objective lens voltage value Eol being a voltage to be applied to the objective lens is derived based on a combination of the acceleration voltage and the beam booster voltage, to thereby set the derived objective lens voltage value Eol. With this configuration, it is possible to perform voltage control that reflects an acceleration energy of the ion beam having entered the beam booster tube, and thus to perform control so as to obtain a desired beam trajectory.

A part, for example, the control unit 9 (9, 9a, 9b, 9c, 9d, 9e, 9f, 9g, 9h, 9i) of the charged particle beam apparatus D1 of the first and third embodiments described above and the composite charged particle beam apparatus D of the second embodiment described above may be implemented by a computer. In this case, the control unit may be implemented by recording a program for implementing the control functions on a computer-readable recording medium so that a computer system reads and executes the program recorded on the recording medium. The "computer system" used herein refers to a computer system incorporated in the charged particle beam apparatus D1 or the composite charged particle beam apparatus D. This computer system is assumed to include an OS, peripheral devices, or other hardware. Further, the "computer-readable recording medium" refers to a portable medium such as a flexible disk, a magneto-optical disk, a ROM, or a CD-ROM, and a storage device such as a hard disk drive incorporated in the computer system. Further, the "computer-readable recording medium" may include a medium configured to dynamically hold a program for a short period of time like a communication line for transmitting a program via a network such as the Internet or a communication link such as a telephone line. Further, in that case, the "computer-readable recording medium" may include a medium configured to hold the program for a certain period of time like a server or a volatile memory in a client computer system. Further, the above-mentioned program may be configured to implement a part of the above-mentioned functions, or may be configured to implement the above-mentioned functions in combination with a program pre-installed in the computer system.

Further, a part or all of the control unit 9 in the first to third embodiments described above may be implemented as an integrated circuit, for example, a large scale integration (LSI) circuit. Functional blocks of the control unit 9 may be provided as different processors, or a part or all of those functional blocks may be integrated into a processor. Further, a technique of forming an integrated circuit is not limited to the LSI, and an integrated circuit may be configured by a dedicated circuit or a general-purpose processor instead. Further, in a case in which, along with progress of a semiconductor technology, a new technology of forming an integrated circuit is developed as a substitute for the LSI, an integrated circuit obtained with such technology may be used.

At least one embodiment of the present invention is described in detail above with reference to the drawings, but the specific configuration thereof is not limited to the foregoing ones, and the present invention encompasses various design modifications and changes within the scope of the gist of the present invention. For example, the second embodiment and the third embodiment (one of the third embodiment and Modification Examples 1 to 5 of the third embodiment) may be combined together.

What is claimed is:

1. A focused ion beam apparatus, comprising:
   an ion source configured to generate ions;
   a first electrostatic lens configured to accelerate and focus the ions to form an ion beam;
   a beam booster electrode configured to accelerate the ion beam to a higher level;
   one or a plurality of electrodes, which are placed in the beam booster electrode, and are configured to electrostatically deflect the ion beam;
   a second electrostatic lens, which is provided between the one or plurality of electrodes and a sample table, and is configured to focus the ion beam applied with a voltage; and
   a processing unit configured to obtain a measurement condition, and set at least one of voltages to be applied to the one or plurality of electrodes or a voltage to be applied to each of the first electrostatic lens and the second electrostatic lens, based on the obtained measurement condition.

2. The focused ion beam apparatus according to claim 1, wherein the processing unit is configured to:
   obtain, from application voltage information in which measurement conditions are associated with information that specifies at least one voltage out of pieces of information that specify voltages to be applied to the one or plurality of electrodes and information that specifies a voltage to be applied to each of the first electrostatic lens and the second electrostatic lens, information that specifies at least one voltage, which corresponds to the obtained measurement condition, out of pieces of information that specify voltages to be applied to the one or plurality of electrodes and information that specifies a voltage to be applied to each of the first electrostatic lens and the second electrostatic lens; and
   set at least one voltage out of the voltages to be applied to the one or plurality of electrodes and the voltage to be applied to each of the first electrostatic lens and the second electrostatic lens, based on the obtained information that specifies at least one voltage.

3. The focused ion beam apparatus according to claim 2, wherein the one or plurality of electrodes include:
   an alignment electrode, which is placed in the beam booster electrode, and is configured to correct a deviation of an optical axis of the ion beam;
   an astigmatism correction electrode, which is placed in the beam booster electrode, and is configured to correct circularity of a sectional shape of the ion beam;
   a blanking electrode, which is placed in the beam booster electrode, and is configured to deflect the ion beam; and
   a first scanning electrode and a second scanning electrode, which are placed in the beam booster electrode, and are configured to scan the ion beam on a sample.

4. The focused ion beam apparatus according to claim 3, wherein the measurement condition includes information that specifies an acceleration voltage and information that specifies a beam booster voltage.

5. The focused ion beam apparatus according to claim 4, wherein the processing unit is configured to obtain, from information that specifies an acceleration voltage and information that specifies a beam booster voltage, a sum of the acceleration voltage and the beam booster voltage, and set at least one voltage out of voltages to be applied to the one or plurality of electrodes, based on the obtained sum.

6. The focused ion beam apparatus according to claim 3, wherein the processing unit is configured to obtain, from information that specifies an acceleration voltage and information that specifies a beam booster voltage, a sum of the acceleration voltage and the beam booster voltage, and set at least one voltage out of voltages to be applied to the one or plurality of electrodes, based on the obtained sum.

7. The focused ion beam apparatus according to claim 2, wherein the measurement condition includes information that specifies an acceleration voltage and information that specifies a beam booster voltage.

8. The focused ion beam apparatus according to claim 7, wherein the processing unit is configured to obtain, from information that specifies an acceleration voltage and information that specifies a beam booster voltage, a sum of the acceleration voltage and the beam booster voltage, and set at least one voltage out of voltages to be applied to the one or plurality of electrodes, based on the obtained sum.

9. The focused ion beam apparatus according to claim 2, wherein the processing unit is configured to obtain, from information that specifies an acceleration voltage and information that specifies a beam booster voltage, a sum of the acceleration voltage and the beam booster voltage, and set at least one voltage out of voltages to be applied to the one or plurality of electrodes, based on the obtained sum.

10. The focused ion beam apparatus according to claim 1, wherein the one or plurality of electrodes include:
- an alignment electrode, which is placed in the beam booster electrode, and is configured to correct a deviation of an optical axis of the ion beam;
- an astigmatism correction electrode, which is placed in the beam booster electrode, and is configured to correct circularity of a sectional shape of the ion beam;
- a blanking electrode, which is placed in the beam booster electrode, and is configured to deflect the ion beam; and
- a first scanning electrode and a second scanning electrode, which are placed in the beam booster electrode, and are configured to scan the ion beam on a sample.

11. The focused ion beam apparatus according to claim 10, wherein the measurement condition includes information that specifies an acceleration voltage and information that specifies a beam booster voltage.

12. The focused ion beam apparatus according to claim 11, wherein the processing unit is configured to obtain, from information that specifies an acceleration voltage and information that specifies a beam booster voltage, a sum of the acceleration voltage and the beam booster voltage, and set at least one voltage out of voltages to be applied to the one or plurality of electrodes, based on the obtained sum.

13. The focused ion beam apparatus according to claim 10, wherein the processing unit is configured to obtain, from information that specifies an acceleration voltage and information that specifies a beam booster voltage, a sum of the acceleration voltage and the beam booster voltage, and set at least one voltage out of voltages to be applied to the one or plurality of electrodes, based on the obtained sum.

14. The focused ion beam apparatus according to claim 1, wherein the measurement condition includes information that specifies an acceleration voltage and information that specifies a beam booster voltage.

15. The focused ion beam apparatus according to claim 14, wherein the processing unit is configured to obtain, from information that specifies an acceleration voltage and information that specifies a beam booster voltage, a sum of the acceleration voltage and the beam booster voltage, and set at least one voltage out of voltages to be applied to the one or plurality of electrodes, based on the obtained sum.

16. The focused ion beam apparatus according to claim 1, wherein the processing unit is configured to obtain, from information that specifies an acceleration voltage and information that specifies a beam booster voltage, a sum of the acceleration voltage and the beam booster voltage, and set at least one voltage out of voltages to be applied to the one or plurality of electrodes, based on the obtained sum.

17. A control method for a focused ion beam apparatus, the focused ion beam apparatus including:
- an ion source configured to generate ions;
- a first electrostatic lens configured to accelerate and focus the ions to form an ion beam;
- a beam booster electrode configured to accelerate the ion beam to a higher level;
- one or a plurality of electrodes, which are placed in the beam booster electrode, and are configured to electrostatically deflect the ion beam; and
- a second electrostatic lens, which is provided between the one or plurality of electrodes and a sample table, and is configured to focus the ion beam applied with a voltage, the control method comprising:
obtaining a measurement condition; and
setting at least one of voltages to be applied to the one or plurality of electrodes or a voltage to be applied to each of the first electrostatic lens and the second electrostatic lens, based on the obtained measurement condition.

* * * * *